United States Patent
Yoon

(10) Patent No.: US 12,148,775 B2
(45) Date of Patent: Nov. 19, 2024

(54) HYPERSPECTRAL ELEMENT, HYPERSPECTRAL SENSOR INCLUDING THE SAME, AND HYPERSPECTRAL IMAGE GENERATING APPARATUS

(71) Applicant: SAMSUNG ELECTRONICS CO., LTD., Suwon-si (KR)

(72) Inventor: Youngzoon Yoon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 475 days.

(21) Appl. No.: 17/497,420

(22) Filed: Oct. 8, 2021

(65) Prior Publication Data

US 2022/0115420 A1   Apr. 14, 2022

(30) Foreign Application Priority Data

Oct. 13, 2020 (KR) .................. 10-2020-0132137
Sep. 6, 2021 (KR) .................. 10-2021-0118543

(51) Int. Cl.
  *H01L 27/146* (2006.01)
  *G02B 5/28* (2006.01)
(52) U.S. Cl.
  CPC .... *H01L 27/1462* (2013.01); *H01L 27/14627* (2013.01); *H01L 27/14643* (2013.01); *G02B 5/28* (2013.01)
(58) Field of Classification Search
  CPC ............... G02B 5/28; G01J 2003/1213; G01J 2003/1226; G01J 2003/2806; G01J 2003/2826; G01J 3/2803
  See application file for complete search history.

(56) References Cited

U.S. PATENT DOCUMENTS

| 6,727,521 B2 | 4/2004 | Merrill |
| 6,958,729 B1 | 10/2005 | Metz |
| 8,045,157 B2 | 10/2011 | Shibayama et al. |
| 9,752,932 B2 * | 9/2017 | Fontecchio ......... G02F 1/13342 |

(Continued)

FOREIGN PATENT DOCUMENTS

| CN | 109827907 A | 5/2019 | |
| EP | 3182079 A1 * | 6/2017 | ............ G01J 3/0259 |

(Continued)

OTHER PUBLICATIONS

Carvalho da Silva, Y., et al., "A Highly Robust Silicon Ultraviolet Selective Radiation Sensor Using Differential Spectral Response Method", Sensors, vol. 19, www.mdpi.com/journal/sensors, pp. 1-14 (Jun. 19, 2019).

(Continued)

*Primary Examiner* — Mamadou L Diallo
(74) *Attorney, Agent, or Firm* — Sughrue Mion, PLLC

(57) ABSTRACT

A hyperspectral element includes (1) a multi filter including: a first sub filter through which first wavelength light having a first wavelength passes; and a second sub filter through which second wavelength light having a second wavelength passes, the second wavelength being different from the first wavelength; and (2) a multi detector configured to detect the first wavelength light and the second wavelength light, wherein the first sub filter and the second sub filter may be arranged in series in an optical path of incident light which is incident onto the multi filter.

23 Claims, 33 Drawing Sheets

(56) References Cited

U.S. PATENT DOCUMENTS

| | | |
|---|---|---|
| 9,857,222 B2 | 1/2018 | Geelen et al. |
| 9,882,154 B2 | 1/2018 | Yamaguchi |
| 10,074,696 B2 | 9/2018 | Joei et al. |
| 10,175,110 B2 | 1/2019 | Kim |
| 10,545,050 B2 | 1/2020 | Yoon et al. |
| 10,571,332 B2 | 2/2020 | Cho et al. |
| 10,571,672 B2* | 2/2020 | Liu .................. G02B 5/201 |
| 10,605,658 B2 | 3/2020 | Yoon et al. |
| 10,904,971 B2 | 1/2021 | Park et al. |
| 10,928,248 B2 | 2/2021 | Kim et al. |
| 11,137,286 B2 | 10/2021 | Cho |
| 2002/0190254 A1 | 12/2002 | Turner et al. |
| 2003/0226977 A1* | 12/2003 | Storz .................. G01N 21/6428 250/458.1 |
| 2009/0236525 A1* | 9/2009 | Mitra .................. G01J 3/36 356/519 |
| 2014/0061486 A1 | 3/2014 | Bao et al. |
| 2018/0045953 A1 | 2/2018 | Fan et al. |
| 2018/0049633 A1* | 2/2018 | Fukunaga ............ A61B 1/0638 |
| 2018/0084167 A1 | 3/2018 | Qian et al. |
| 2018/0372546 A1* | 12/2018 | Enichlmair .............. G01J 3/26 |
| 2019/0096932 A1 | 3/2019 | Hsieh et al. |
| 2019/0154503 A1 | 5/2019 | Yoon et al. |
| 2019/0189696 A1* | 6/2019 | Yamaguchi ............ H04N 23/12 |
| 2020/0021782 A1 | 1/2020 | Sugizaki |
| 2020/0072667 A1 | 3/2020 | Yoon et al. |
| 2020/0073033 A1* | 3/2020 | Baik .................. G01J 3/26 |
| 2020/0116567 A1 | 4/2020 | Yoon et al. |
| 2020/0240840 A1* | 7/2020 | Darty .................. G01J 3/0264 |
| 2021/0127101 A1 | 4/2021 | Roh et al. |
| 2021/0152681 A1 | 5/2021 | Yoon et al. |
| 2021/0176412 A1 | 6/2021 | Yoon et al. |
| 2021/0318171 A1* | 10/2021 | Inada .................. G01J 3/2823 |
| 2022/0003907 A1* | 1/2022 | Borremans ........... G01J 3/0262 |
| 2022/0173144 A1* | 6/2022 | Lee .................... H01L 27/14627 |
| 2023/0073201 A1* | 3/2023 | Yako ........................ G02B 5/28 |

FOREIGN PATENT DOCUMENTS

| | | | |
|---|---|---|---|
| EP | 3488770 A1 | 5/2019 | |
| EP | 3757603 A1 * | 12/2020 | ......... A61B 1/00009 |
| JP | 5793219 B1 | 10/2015 | |
| JP | 2020053910 A | 4/2020 | |
| KR | 1020160144006 A | 12/2016 | |
| KR | 102040368 A | 11/2019 | |
| KR | 102040368 B1 | 11/2019 | |
| KR | 1020210061044 A | 5/2021 | |
| KR | 1020210070801 A | 6/2021 | |

OTHER PUBLICATIONS

Communication issued Feb. 21, 2022 by the European Patent Office in counterpart European Patent Application No. 21202397.2.

Communication issued May 11, 2022 by the European Patent Office in counterpart European Patent Application No. 21202397.2.

Horie, Yu et al., "Wide bandwidth and high resolution planer filter array based on DBR-metasurface-DBR structures", arXiv:1604.03167v1 [physics.optics], Apr. 11, 2016, arxiv.org, Cornell University Library, 201 Olin Library Cornell University, Ithaca, NY, 14853, XP080964216. (6 pages total).

Blair, Steven et al., "A 27-band snapshot hyperspectral imaging system for label-free tumor detection during image-guided surgery", Progress in Biomedical Optics and Imaging, SPIE—International Society for Optical Engineering, vol. 10890, Mar. 4, 2019, pp. 108900G-1-108900G-9, XP060117237.

\* cited by examiner

HYPERSPECTRAL ELEMENT, HYPERSPECTRAL SENSOR INCLUDING THE SAME, AND HYPERSPECTRAL IMAGE GENERATING APPARATUS

CROSS-REFERENCE TO RELATED APPLICATION

This application is based on and claims priority under 35 U.S.C. § 119 to Korean Patent Application No. 10-2020-0132137, filed on Oct. 13, 2020, in the Korean Intellectual Property Office, and Korean Patent Application No. 10-2021-0 118543, filed on Sep. 6, 2021, in the Korean Intellectual Property Office, the disclosure of which is incorporated by reference herein in its entirety.

BACKGROUND

1. Field

Apparatuses and methods consistent with example embodiments relate to a hyperspectral element, a hyperspectral sensor, and a hyperspectral image generating apparatus.

2. Description of Related Art

An image sensor using a spectral filter is an important optical device in the optical field. Because an image sensor of the related art includes various optical devices, the image sensor is bulky and heavy. Recently, in response to a demand for miniaturization of the image sensor, research into simultaneously implementing an integrated circuit and an optical device on a single semiconductor chip has been conducted.

Hyperspectral imaging technology relates to a method of simultaneously acquiring images and spectral information. Methods of generating hyperspectral images are largely classified into a scanning method and a non-scanning snapshot method. The scanning method may be implemented by combining scanning equipment with an image sensor for spectroscopy. The non-scanning snapshot method is a hyperspectral measurement method by implementing different filters directly on the image pixels.

The scanning hyperspectral measurement method is advantageous in obtaining high-resolution hyperspectral images, but a measurement time is long and it is difficult to miniaturize the equipment according to scanning. The non-scanning snapshot method may be measured in a short time like a general camera and has the advantage of miniaturization, but for the resolution of a spectrum, a space of image pixels is limited and the image resolution deteriorates.

SUMMARY

Example embodiments address at least the above problems and/or disadvantages and other disadvantages not described above. Also, the example embodiments are not required to overcome the disadvantages described above, and may not overcome any of the problems described above.

One or more example embodiments provide hyperspectral elements having high resolution and broadband characteristics.

Further, one or more example embodiments provide hyperspectral sensors having high resolution and broadband characteristics.

Still further, one or more example embodiments provide hyperspectral image generating apparatuses having high resolution and broadband characteristics.

According to an aspect of an embodiment, there is provided a hyperspectral element including (1) a multi filter including: a first sub filter through which first wavelength light having a first wavelength passes; and a second sub filter through which second wavelength light having a second wavelength passes, the second wavelength being different from the first wavelength; and (2) a multi detector configured to detect the first wavelength light and the second wavelength light, wherein the first sub filter and the second sub filter are arranged in series in an optical path of incident light which is incident onto the multi filter.

A light transmission spectrum of the first sub filter may include a first use band and a first sub light transmission region outside the first use band, a light transmission spectrum of the second sub filter may include a second use band and a second sub light transmission region outside the second use band, the first wavelength is included in the first use band and the second sub light transmission region, and the second wavelength is included in the second use band and the first sub light transmission region. The first sub filter may be configured to filter out first remaining wavelengths other than the first wavelength from the first use band, and the second sub filter may be configured to filter out second remaining wavelengths other than the second wavelength from the second use band.

The first use band and the second use band may partially overlap.

The multi filter may include a first sub detector including a first light detection band overlapping the first wavelength and the second wavelength; and a second sub detector including a second light detection band overlapping any one of the first wavelength and the second wavelength, and the first sub detector and the second sub detector are arranged in series.

The hyperspectral element may further include a spectroscopic processor, the first sub detector is configured to generate and provide a first channel signal with respect to the first wavelength light and the second wavelength light to the spectroscopic processor, the second sub detector is configured to generate and provide a second channel signal with respect to the second wavelength light to the spectroscopic processor, and the spectroscopic processor is configured to generate information about intensities of the first and second wavelength lights based on the first and second channel signals.

The multi detector may further include an ultraviolet detector, and the ultraviolet detector is arranged in series with the first sub detector and the second sub detector, in the optical path of the incident light.

The multi detector may further include an infrared detector, and the infrared detector may be arranged in series with the first sub detector and the second sub detector, in the optical path of the incident light.

Each of the first sub filter and the second sub filter may include first refractive index films and second refractive index films that are alternately stacked, and the first refractive index layers may have different refractive indexes than the second refractive index layers.

The first refractive index films of the first sub filter and the first refractive index films of the second sub filter may have different thicknesses.

Each of the first sub filter and the second sub filter may include: a first reflective layer; a second reflective layer; and a nanostructure layer provided between the first reflective layer and the second reflective layer, the nanostructure layer may include a plurality of nano rods, and the plurality of nano rods may be asymmetrically arranged.

Each of the first sub filter and the second sub filter may include: a first reflective layer; a second reflective layer; and a nanostructure layer provided between the first reflective layer and the second reflective layer, the nanostructure layer may include a plurality of nano holes, and the plurality of nano holes may be asymmetrically arranged.

The multi detector may include n-type films and p-type films that are alternately stacked, and the n-type films and the p-type films may form a first photodiode and a second photodiode, respectively, and the second photodiode may be arranged more inside the multi detector than the first photodiode.

The multi filter may be provided on the multi detector, the first photodiode is configured to detect the first wavelength light and the second wavelength light, and the second photodiode is configured to detect light having a relatively long wavelength among the first wavelength light and the second wavelength light.

The hyperspectral element may further include a spectroscopic processor; the first photodiode is configured to generate and provide a first channel signal with respect to the first wavelength light and the second wavelength light to the spectroscopic processor, the second photodiode is configured to generate and provide a second channel signal with respect to the second wavelength light to the spectroscopic processor, and the spectroscopic processor is configured to generate information about intensities of the first and second wavelength lights based on the first and second channel signals.

The hyperspectral element may further include a micro lens, and the micro lens may be disposed in series with the multi filter, and collects incident light into the multi filter.

According to an aspect of another embodiment, a hyperspectral sensor includes a plurality of pixels configured to sense a light transmission spectrum of incident light; a spectroscopic processor; and a main processor, each of the plurality of pixels may include a first multi filter through which first wavelength light having a first wavelength and second wavelength light having a second wavelength pass, the second wavelength being longer than the first wavelength, among the incident light, a first multi detector configured to generate and provide a first channel signal with respect to the first and second wavelength lights and a second channel signal with respect to the second wavelength light to the spectroscopic processor, a second multi filter through which third wavelength light having a third wavelength and fourth wavelength light having a fourth wavelength pass, among the incident light, the fourth wavelength being longer than the third wavelength, and a second multi detector configured to generate and provide a third channel signal with respect to the third and fourth wavelength lights and a fourth channel signal with respect to the fourth wavelength light to the spectroscopic processor, and the spectroscopic processor is configured to generate and provide information about intensities of the first to fourth wavelength lights based on the first to fourth channel signals to the main processor.

The first multi filter may include a first sub filter and a second sub filter, a light transmission spectrum of the first sub filter may include a first use band and a first sub light transmission region outside the first use band, a light transmission spectrum of the second sub filter may include a second use band and a second sub light transmission region outside the second use band, the first wavelength is included in the first use band and the second sub light transmission region, and the second wavelength is included in the second use band and the first sub light transmission region.

The first use band and the second use band may partially overlap.

The second multi filter may include a third sub filter and a fourth sub filter, a light transmission spectrum of the third sub filter may include a third use band and a third sub light transmission region, a light transmission spectrum of the fourth sub filter may include a fourth use band and a fourth sub light transmission region, the third wavelength may be included in the third use band and the fourth sub light transmission region, and the fourth wavelength may be included in the fourth use band and the third sub light transmission region.

The third use band and the fourth use band may partially overlap.

The first multi filter and the second multi filter may be arranged in parallel, the first sub filter and the second sub filter may be arranged in series in an optical path of the incident light, and the third sub filter and the fourth sub filter may be arranged in series in an optical path of the incident light.

The first multi detector may include: a first sub detector configured to receive the first wavelength light and the second wavelength light and generate the first channel signal; and a second sub detector configured to receive the second wavelength light and generate the second channel signal, and the second multi detector includes: a third sub detector configured to receive the third wavelength light and the fourth wavelength light and generate the third channel signal; and a fourth sub detector configured to receive the fourth wavelength light and generate the fourth channel signal.

In each of the second multi detectors, the first sub detector and the second sub detector may be arranged in series in an optical path of the incident light.

According to an aspect of another embodiment, a hyperspectral image generating apparatus includes the hyperspectral element configured to receive the incident light provided from a measurement target to generate a first channel signal with respect light having a first wavelength and light having a second wavelength, and a second channel signal with respect to the light having the first wavelength; a spectroscopic processor configured to generate first hyperspectral information about an intensity of the light having the first wavelength for each position of the measurement target and second hyperspectral information about an intensity of the light having the second wavelength for each position of the measurement target based on the first channel signal and the second channel signal; a main processor configured to generate hyperspectral image information based on the first hyperspectral information and the second hyperspectral information; and a display displaying a hyperspectral image based on the hyperspectral image information.

BRIEF DESCRIPTION OF THE DRAWINGS

The above and/or other aspects will be more apparent by describing certain example embodiments, with reference to the accompanying drawings, in which.

DETAILED DESCRIPTION

Figure 1:
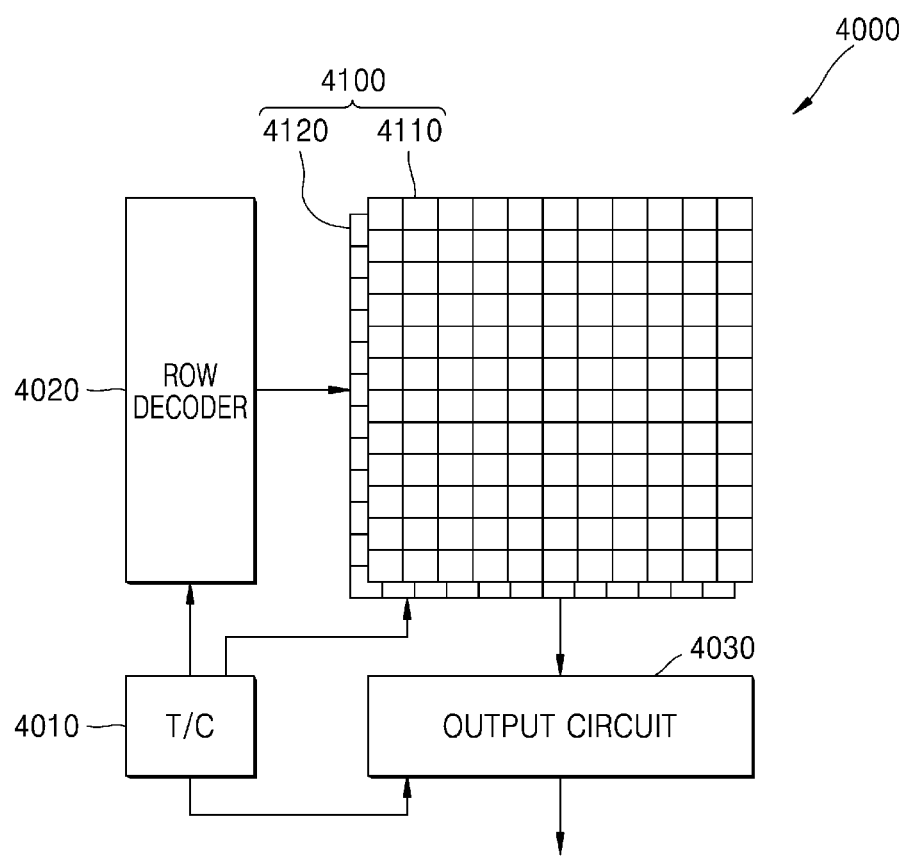
FIG. 1 is a schematic block diagram of an image sensor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments will now be described in detail with reference to the accompanying drawings. The embodiments to be described are merely examples, and various modifications may be made from the embodiments. In the following drawings, like reference numerals in the drawings denote like elements, and a size of each element in the drawings may be exaggerated for the sake of clear and convenient description.

Hereinafter, what is described as "upper" or "above" may include not only those directly above in contact therewith, but also those above without being in contact therewith.

Singular expressions include plural expressions unless the context clearly indicates otherwise. In addition, when a portion "includes" a certain element, this indicates that other elements may be further included rather than excluding other elements unless specifically stated to the contrary.

Hereinafter, "to be arranged in series" means to be arranged on one optical path.

Hereinafter, "to be arranged in parallel" means to be arranged on different optical paths.

FIG. 1 is a schematic block diagram of an image sensor 4000 according to an embodiment. Referring to FIG. 1, the image sensor 4000 may include a pixel array 4100, a timing controller 4010, a row decoder 4020, and an output circuit 4030. The image sensor 4000 may include a charge coupled device (CCD) image sensor or a complementary metal oxide semiconductor (CMOS) image sensor but is not limited thereto.

The pixel array 4100 may include a multi filter array 4110 and a multi detector array 4120. The multi filter array 4110 receives light of different wavelength bands which are incident thereon, and selectively passes light of certain wavelength bands. The multi filter array 4110 may include a plurality of multi filters that are two-dimensionally arranged.

The multi detector array 4120 includes a plurality of multi detectors that detect the light of different wavelength bands that have transmitted the plurality of multi filters. Specifically, the multi detector array 4120 includes the multi detectors that are two-dimensionally arranged along a plurality of rows and columns.

The pixel array 4100 may include a plurality of pixels that are two-dimensionally arranged. Each of the plurality of pixels may include a plurality of sub-pixels. Each of the plurality of sub-pixels may include a multi filter and a multi detector that correspond to and are aligned with each other. The arrangement of the plurality of pixels may be implemented in various ways.

The row decoder 4020 selects one of the rows in the multi detector array 4120 in response to a row address signal output from the timing controller 4010. The output circuit 4030 outputs a light detection signal, in a column unit, from the plurality of multi detectors arranged in the selected row. To this end, the output circuit 4030 may include a column decoder and an analog-to-digital converter (ADC). For example, the output circuit 4030 may include a plurality of ADCs arranged respectively according to the columns between the column decoder and the multi detector array 4120 or one ADC disposed at an output end of the column decoder. The timing controller 4010, the row decoder 4020, and the output circuit 4030 may be implemented as one chip or separate chips. A processor for processing an image signal output from the output circuit 4030 may be implemented as one chip with the timing controller 4010, the row decoder 4020, and the output circuit 4030.

Figure 2:
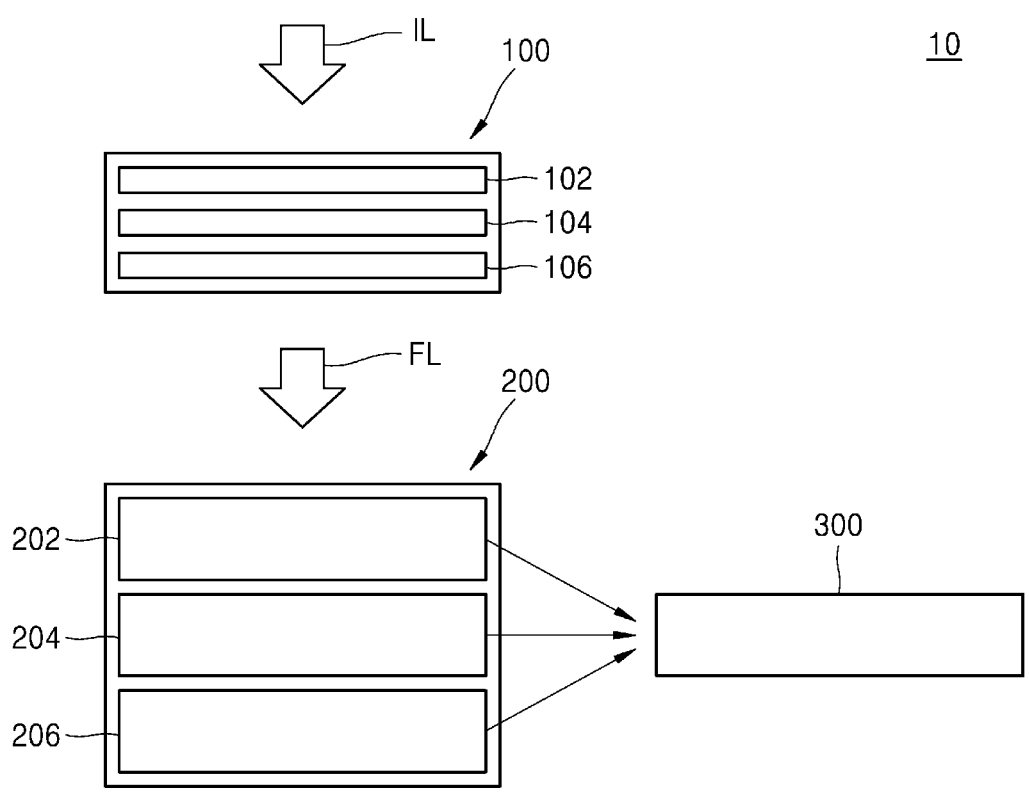
FIG. 2 is a block diagram of a hyperspectral element according to an embodiment.
Figure 3:
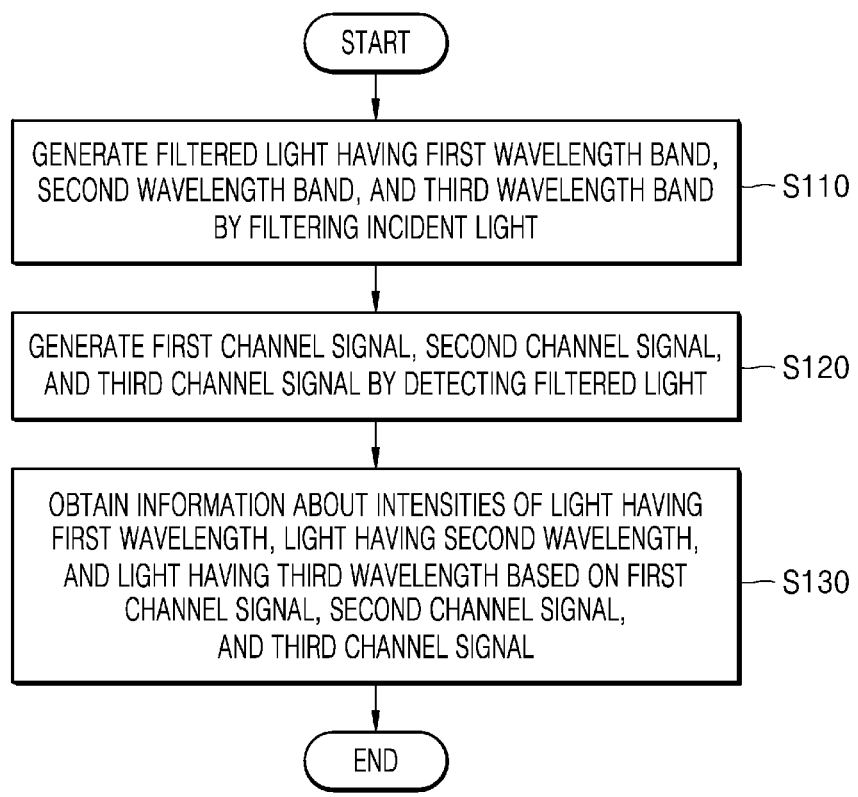
FIG. 3 is a flowchart illustrating a method of measuring light using the hyperspectral element of FIG. 2.
Figure 4:
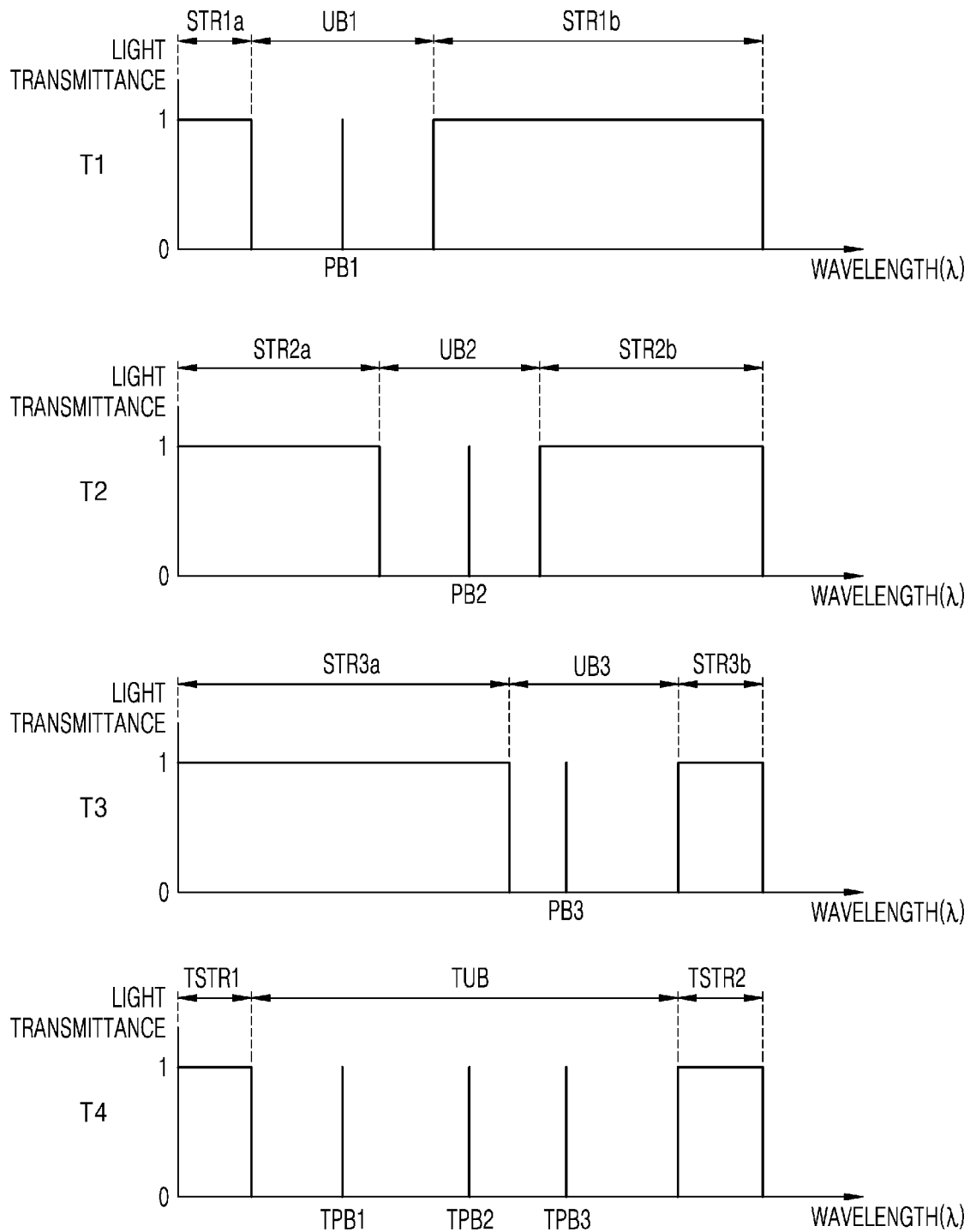
FIG. 4 shows light transmission spectra of first to third sub filters and a light transmission spectrum of a multi filter of FIG. 2.
Figure 5:
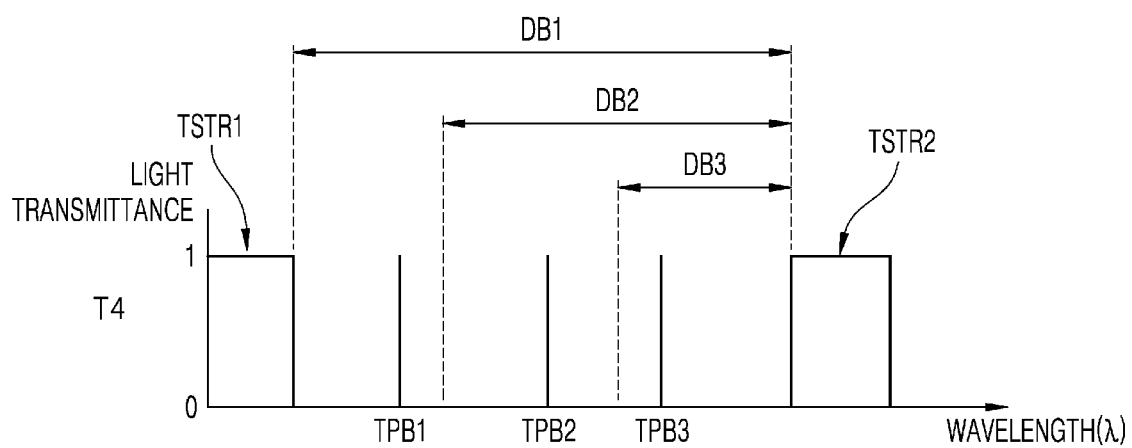
FIG. 5 shows the light transmission spectrum of the multi filter and light detection bands of the first to third sub detectors of FIG. 2.

FIG. 2 is a block diagram of a hyperspectral element 10 according to an embodiment. FIG. 3 is a flowchart illustrating a method of measuring light using the hyperspectral element 10 of FIG. 2. FIG. 4 shows light transmission spectra of first to third sub filters and a light transmission spectrum of a multi filter of FIG. 2. FIG. 5 shows the light transmission spectrum of the multi filter and light detection bands of first to third sub detectors of FIG. 2.

Referring to FIG. 2, the hyperspectral element 10 may be provided. The hyperspectral element 10 may include a multi filter 100, a multi detector 200, and a spectroscopic processor 300. The multi filter 100 and the multi detector 200 may be included in the multi filter array (4110 of FIG. 1) and the multi detector array (4120 of FIG. 1) described with reference to FIG. 1, respectively. In other words, the multi filter 100 may be one of a plurality of multi filters constituting the multi filter array (4110 in FIG. 1), and the multi detector 200 may be one of a plurality of multi detectors constituting the multi detector array (4120 in FIG. 1). The spectroscopic processor 300 may be substantially the same as the processor described with reference to FIG. 1. The multi filter 100 and the multi detector 200 may be arranged in series. In the present specification, "series arrangement" means arrangement on one optical path. The multi filter 100 and the multi detector 200 may be arranged on the optical path of incident light IL. For example, the incident light IL may sequentially pass through the multi filter 100 and the multi detector 200.

The multi filter 100 may include a plurality of sub filters 102, 104, and 106 that are stacked onto each other. The plurality of sub filters 102, 104, and 106 may have different light transmission characteristics. Light transmission spectra of the plurality of sub filters 102, 104, and 106 may be different from each other. Although the multi filter 100 is illustrated as including the first sub filter 102, the second sub filter 104, and the third sub filter 106, the number of sub filters is not limited. In another embodiment, the multi filter 100 may include less or more than three sub filters. The multi filter 100 may emit filtered light FL. The filtered light FL may be the incident light IL filtered by the multi filter 100. The filtered light FL may have a plurality of wavelength bands determined according to different light transmission characteristics of the plurality of sub filters 102, 104, and 106. Light transmission spectra of the first sub filter 102, the second sub filter 104, the third sub filter 106, and the multi filter 100 will be described later.

The multi detector 200 may detect the filtered light FL. The multi detector 200 may include a plurality of sub detectors 202, 204, and 206 that are stacked onto each other. The plurality of sub detectors 202, 204, and 206 may have different light detection characteristics. Light detection characteristics of the plurality of sub detectors 202, 204, and 206 will be described later. Although the multi detector 200 is illustrated as including the first sub detector 202, the second sub detector 204, and the third sub detector 206, the number of sub detectors is not limited. In another embodiment, the multi detector 200 may include less or more than three sub detectors. The first sub detector 202, the second sub detector 204, and the third sub detector 206 may be arranged in series. For example, the first sub detector 202, the second sub detector 204, and the third sub detector 206 may be sequentially arranged on the optical path of the filtered light FL.

The multi filter 100 and the multi detector 200 of the present disclosure may be provided in one sub pixel to be described later. The first to third sub filters 102, 104, and 106 and the first to third sub detectors 202, 204, and 206 may be combined to measure a plurality of wavelength bands required in one sub pixel. Hereinafter, a method, performed by the hyperspectral element 10, of measuring a plurality of wavelength bands is described.

Referring to FIGS. 3 and 4, the incident light IL may be filtered by the multi filter 100 to generate the filtered light FL having a first wavelength band, a second wavelength band, and a third wavelength band (operation S110). The incident light IL may be propagated from an object that is a measurement target and may be incident onto the multi filter 100. The filtered light FL may be obtained by passing the first to third wavelength bands of the incident light IL and filtering out the remaining wavelengths excluding the first to third wavelength bands, from the incident light IL. In FIG. 3, a light transmission spectrum T1 of the first sub filter 102, a light transmission spectrum T2 of the second sub filter 104, a light transmission spectrum T3 of the third sub filter 106, and a light transmission spectrum T4 of the multi filter 100 are illustrated. For convenience of description, the transmittance of the first to third sub filters 102, 104, and 106 and the light transmittance of the multi filter 100 are indicated as 0 or 1.

The light transmission spectrum T1 of the first sub filter 102 may include a first pass wavelength PB1, a first use band UB1, a 1a-th sub light transmission region STR1$a$, and a 1b-th sub light transmission region STR1$b$. The first use band UB1 may be provided between the 1a-th sub light transmission region STR1$a$ and the 1b-th sub light transmission region STR1$b$. In other words, the 1a-th sub light transmission region STR1$a$ and the 1b-th sub light transmission region STR1$b$ may be regions outside the first use band UB1. The first pass wavelength PB1 may be adjusted within the first use band UB1. Light having the remaining wavelengths excluding the first pass wavelength PB1 in the first use band UB1 may be blocked by the first sub filter 102. The first use band UB1 may be a wavelength band in which the first sub filter 102 may serve as a transmission filter through which light having a specific wavelength passes.

The light transmission spectrum T2 of the second sub filter 104 may include a second pass wavelength PB2, a 2a-th sub light transmission region STR2$a$, and a 2b-th sub light transmission region STR2$b$. The second use band UB2 may be provided between the 2a-th sub light transmission region STR2$a$ and the 2b-th sub light transmission region STR2$b$. In other words, the 2a-th sub light transmission region STR2$a$ and the 2b-th sub light transmission region STR2$b$ may be regions outside the second use band UB2. The second pass wavelength PB2 may be adjusted within the second use band UB2. Light having the remaining wavelengths excluding the second pass wavelength PB2 in the second use band UB2 may be blocked by the second sub filter 104. The second use band UB2 may be a wavelength band in which the second sub filter 104 may serve as a transmission filter through which light having a specific wavelength passes.

The light transmission spectrum T3 of the third sub filter 106 may include a third pass wavelength PB3, a 3a-th sub light transmission region STR3$a$, and a 3b-th sub light transmission region STR3$b$. The third use band UB3 may be provided between the 3a-th sub light transmission region STR3$a$ and the 3b-th sub light transmission region STR3$b$. In other words, the 3a-th sub light transmission region STR3$a$ and the 3b-th sub light transmission region STR3$b$ may be regions outside the third use band UB3. The third pass wavelength PB3 may be adjusted within the third use band UB3. Light having the remaining wavelengths excluding the third pass wavelength PB3 in the third use band UB3 may be blocked by the third sub filter 106. The third use band UB3 may be a wavelength band in which the third sub filter 106 may serve as a transmission filter through which light having a specific wavelength passes.

The first use band UB1 may overlap any one of the 2a-th sub light transmission region STR2$a$ and the 2b-th sub light transmission region STR2$b$ and any one of the 3a-th sub light transmission region STR3$a$ and the 3b-th sub light transmission region STR3$b$. For example, the first use band UB1 may be (completely) covered by the 2a-th sub light transmission region STR2$a$ and the 3a-th sub light transmission region STR3*a*. It is illustrated that the first use band UB1 partially overlaps the 2a-th sub light transmission region STR2*a* and completely overlaps the 3a-th sub light transmission region STR3*a*, but this is an example, as another example, the first use band UB1 may completely overlap the 2a-th sub light transmission region STR2*a* and the 3a-th sub light transmission region STR3*a*.

The first pass wavelength PB1 may be determined to completely overlap any one of the 2a-th sub light transmission region STR2*a* and the 2b-th sub light transmission region STR2*b* overlapping the first use band UB1 and any one of the 3a-th sub light transmission region STR3*a* and the 3b-th sub light transmission region STR3*b*. For example, the first pass wavelength PB1 may completely overlap the 2a-th sub light transmission region STR2*a* and the 3a-th sub light transmission region STR3*a*. The second use band UB2 may overlap any one of the 1a-th sub light transmission region STR1*a* and the 1b-th sub light transmission region STR1*b* and any one of the 3a-th sub light transmission region STR3*a* and the 3b-th sub light transmission region STR3*b*. For example, the second use band UB2 may overlap the 1b-th sub light transmission region STR1*b* and the 3a-th sub light transmission region STR3*a*. It is illustrated that the second use band UB2 partially overlaps each of the 1b-th sub light transmission region STR1*b* and the 3a-th sub light transmission region STR3*a*, but this is an example. As another example, the second use band UB2 may completely overlap the 1b-th sub light transmission region STR1*b* and the 3a-th sub light transmission region STR3*a*.

The second pass wavelength PB2 may be determined to completely overlap any one of the 1a-th sub light transmission region STR1*a* and the 1b-th sub light transmission region STR1*b* overlapping second use band UB2 and any one of the 3a-th sub light transmission region STR3*a* and the 3b-th sub light transmission region STR3*b*. For example, the second pass wavelength PB2 may completely overlap the 1b-th sub light transmission region STR1*b* and the 3a-th sub light transmission region STR3*a*.

The third use band UB3 may overlap any one of the 1a-th sub light transmission region STR1*a* and the 1b-th sub light transmission region STR1*b* and any one of the 2a-th sub light transmission region STR2*a* and the 2b-th sub light transmission region STR2*b*. For example, the third use band UB3 may overlap the 2b-th sub light transmission region STR2*b* and the 1b-th sub light transmission region STR1*b*. It is illustrated that the third use band UB3 completely overlaps the 1b-th sub light transmission region STR1*b* and partially overlaps the 2b-th sub light transmission region STR2*b*, but this is an example. As another example, the third use band UB3 may completely overlap the 2b-th sub light transmission region STR2*b* and the 1b-th sub light transmission region STR1*b*.

The third pass wavelength PB3 may be determined to completely overlap any one of the 1a-th sub light transmission region STR1*a* and the 1b-th sub light transmission region STR1*b* and the 2a sub light transmitting area STR2*a* overlapping the third use band UB3 and any one of the 2a-th sub light transmission region STR2*a* and the 2b-th sub light transmission region STR2*b*. For example, the third pass wavelength PB3 may completely overlap the 1b-th sub light transmission region STR1*b* and the 2b-th sub light transmission region STR2*b*.

The 1a-th sub light transmission region STR1*a*, the 2a-th sub light transmission region STR2*a*, and the 3a-th sub light transmission region STR3*a* may include an overlapping region. For example, the region in which the 1a-th sub light transmission region STR1*a*, the 2a-th sub light transmission region STR2*a*, and the 3a-th sub light transmission region STR3*a* overlap each other may be substantially the same as the 1a-th sub light transmission region STR1*a*. The 1b-th sub light transmission region STR1*b*, the 2b-th sub light transmission region STR2*b*, and the 3b-th sub light transmission region STR3*b* may include an overlapping region. For example, the region in which the 1b-th sub light transmission region STR1*b*, the 2b-th sub light transmission region STR2*b*, and the 3b-th sub light transmission region STR3*b* overlap each other may be substantially the same as the 3b-th sub light transmission region STR3*b*.

The light transmission spectrum T4 of the multi filter 100 may be determined according to the light transmission spectrum T1 of the first sub filter 102, the light transmission spectrum T2 of the second sub filter 104, and the light transmission spectrum T3 of the third sub filter 106. A wavelength region passing through the multi filter 100 may be a wavelength region passing through all of the first sub filter 102, the second sub filter 104, and the third sub filter 106. A wavelength region that does not pass through the multi filter 100 may be a wavelength region that does not pass through at least one of the first sub filter 102, the second sub filter 104, or the third sub filter 106.

The light transmission spectrum T4 of the multi filter 100 may include a first final pass wavelength TPB1, a second final pass wavelength TPB2, and a third final pass wavelength TPB3. The first final pass wavelength TPB1, the second final pass wavelength TPB2, and the third final pass wavelength TPB3 may be substantially and respectively the same as the first pass wavelength PB1, the second pass wavelength PB2, and the third pass wavelength PB3.

The light transmission spectrum T4 of the multi filter 100 may include a first final sub light transmission region TSTR1 and a second final sub light transmission region TSTR2. The first final sub light transmission region TSTR1 may be substantially the same as a region in which all of the 1a-th sub light transmission region STR1*a*, the 2a-th sub light transmission region STR2*a*, and the 3a-th sub light transmission region STR3*a* overlap. For example, the first final sub light transmission region TSTR1 may be substantially the same as the 1a-th sub light transmission region STR1*a*. The second final sub light transmission region TSTR2 may be substantially the same as a region in which all of the 1b-th sub light transmission region STR1*b*, the 2b-th sub light transmission region STR2*b*, and the 3b-th sub light transmission region STR3*b* overlap. For example, the second final sub light transmission region TSTR2 may be substantially the same as the 3b-th sub light transmission region STR3*b*.

A wavelength band between the first final sub light transmission region TSTR1 and the second final sub light transmission region TSTR2 may be referred to as a final use band TUB. The final use band TUB may be a wavelength band in which the multi filter 100 may serve as a transmission filter through which light having a specific wavelength passes. The final use band TUB may be a sum of the first use band UB1, the second use band UB2, and the third use band UB3. The final use band TUB may be wider than each of the first use band UB1, the second use band UB2, and the third use band UB3.

The present disclosure may provide the multi filter 100 having a wider band of use than one sub filter 102, 104, or 106.

Referring to FIGS. 3 and 5, the light transmission spectrum T4 of the multi filter 100, the first light detection band DB1 of the first sub detector 202, the second light detection band DB2 of the second sub detector 204, and the third light detection band DB3 of the third sub detector 206 may be provided. The first to third sub detectors 202, 204, and 206 may respectively detect the filtered light FL and generate a first channel signal, a second channel signal, and a third channel signal. (operation S120) The first to third light detection bands DB1, DB2, and DB3 may be respectively a wavelength band detectable by the first sub detector 202, a wavelength band detectable by the second sub detector 204, and a wavelength band detectable by the third sub detector 206. The first to third light detection bands DB1, DB2, and DB3 may overlap each other. For example, the second and third light detection bands DB2 and DB3 may be included in the first light detection band DB1, and the third light detection band DB3 may be included in the second light detection band DB2. In an example, the first to third light detection bands DB1, DB2, and DB3 may be provided between the first final sub light transmission region TSTR1 and the second final sub light transmission region TSTR2. The first to third light detection bands DB1, DB2, and DB3 may not detect light having a wavelength in the first final sub light transmission region TSTR1 and the second final sub light transmission region TSTR2. The first light detection band DB1 may include a first final pass wavelength TPB1, a second final pass wavelength TPB2, and a third final pass wavelength TPB3. The first to third final pass wavelengths TPB1, TPB2, and TPB3 may be detected by the first sub detector 202. The first sub detector 202 may generate the first channel signal with respect to the first to third final pass wavelengths TPB1, TPB2, and TPB3. The first channel signal may be an electrical signal with respect to the first final pass wavelength TBP1, the second final pass wavelength TBP2, and the third final pass wavelength TBP3. The first sub detector 202 may provide the first channel signal to the spectroscopic processor 300.

The second light detection band DB2 may include the second final pass wavelength TPB2 and the third final pass wavelength TPB3, and may not include the first final pass wavelength TPB1. The second final pass wavelength TPB2 and the third final pass wavelength TPB3 may be detected by the second sub detector 204. The second sub detector 204 may generate the second channel signal with respect to the second final pass wavelength TPB2 and the third final pass wavelength TPB3. The second channel signal may be an electric signal with respect to the second final pass wavelength TBP2 and the third final pass wavelength TBP3. The second sub detector 204 may provide the second channel signal to the spectroscopic processor 300.

The third light detection band DB3 may include the third final pass wavelength TPB3 and may not include the first and second final pass wavelengths TBP1 and TPB2. The third final pass wavelength TPB3 may be detected by the third sub detector 206. The third sub detector 206 may generate the third channel signal with respect to a third pass wavelength. The third channel signal may be an electrical signal with respect to the third pass wavelength. The third sub detector 206 may provide the third channel signal to the spectroscopic processor 300.

The spectroscopic processor 300 may generate information about intensities of light having the first final pass wavelength TBP1, light having the second final pass wavelength TBP2, and light having the third final pass wavelength TBP3 based on the first to third channel signals. (operation S130)

The present disclosure may provide the multi filter 100 including the plurality of sub filters 102, 104 and 106 arranged in series. The final use band TUB of the multi filter 100 may be equal to the sum of the first, second, and third use bands UB1, UB2, and UB3 of the plurality of sub filters 102, 104, and 106. The multi filter 100 may have a wider usable bandwidth than that of each of the sub filters 102, 104, and 106. The multi detector 200 of the present disclosure may include the plurality of sub detectors 202, 204, and 206 to detect pieces of light having a plurality of wavelengths. The plurality of sub detectors 202, 204, 206 may be arranged within one sub pixel. Accordingly, one sub pixel may have a large area. Accordingly, the hyperspectral element 10 may have a high resolution.

Figure 6:
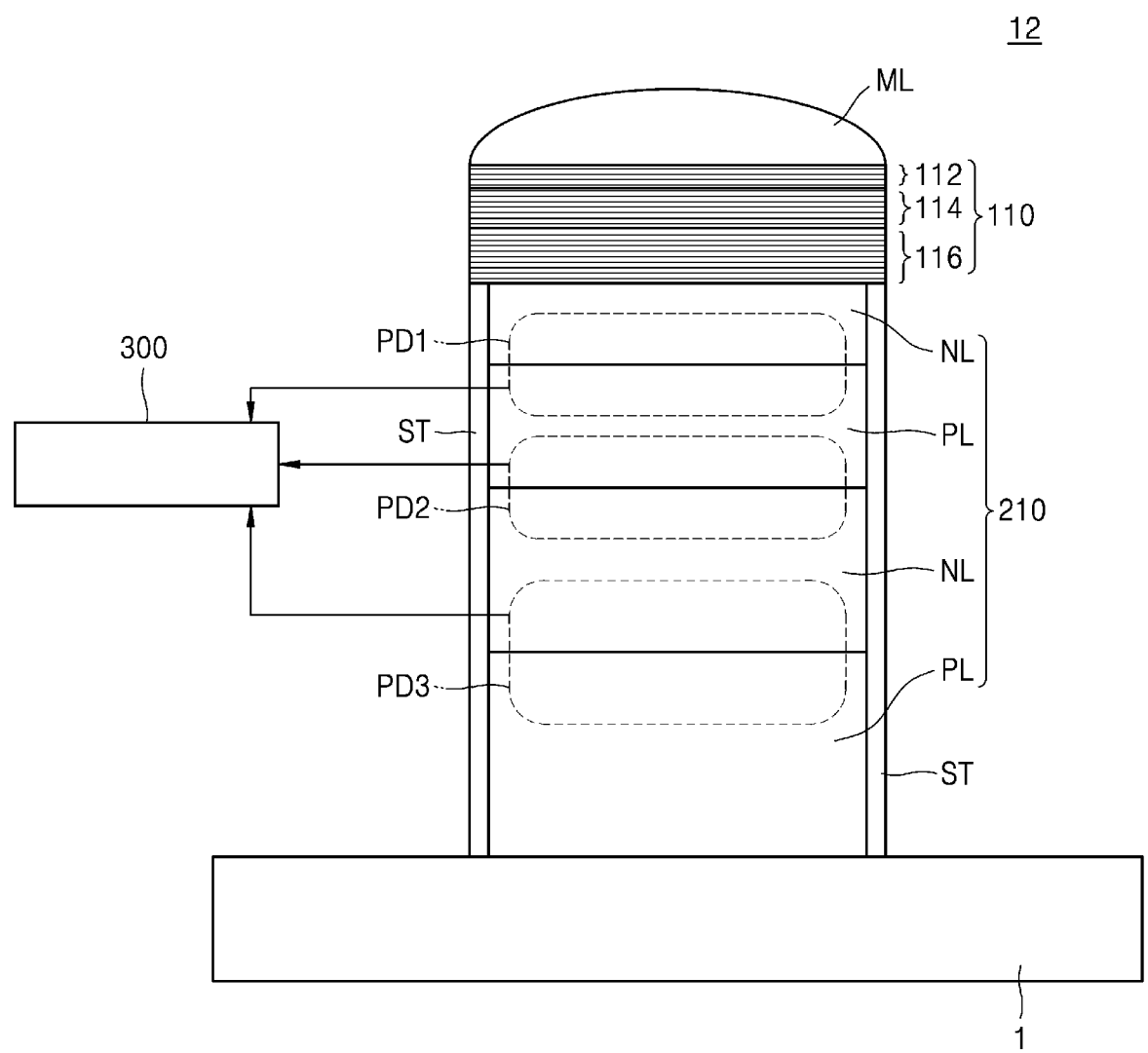
FIG. 6 is a cross-sectional view of a hyperspectral element according to an embodiment.

FIG. 6 is a cross-sectional view of a hyperspectral element 12 according to an embodiment.

Referring to FIG. 6, the hyperspectral element 12 may be provided. The hyperspectral element 12 may include a multi detector 210, a light blocking layer ST, a multi filter 110, a micro lens ML, and the spectroscopic processor 300. The multi detector 210 and the multi filter 110 may have substantially the same characteristics as those described with reference to FIGS. 2 to 5.

A substrate 1 may include a semiconductor material. For example, the substrate 1 may be a silicon (Si) substrate, a germanium (Ge) substrate, or a silicon germanium (SiGe) substrate. The substrate 1 may include electronic devices. Electronic devices may form a processor that controls the multi detector 210 and receives a channel signal from the multi detector 210. For example, the multi detector 210 may be electrically connected to electronic devices.

The light detection characteristics of the multi detector 210 may be substantially the same as the light detection characteristics of the multi detector 200 described with reference to FIGS. 2 to 5. The multi detector 210 may include a plurality of p-type layers PL and a plurality of n-type layers NL that are alternately stacked. In FIG. 6, two p-type layers PL and two n-type layers NL are illustrated as an example. The two p-type layers PL and the two n-type layers NL may be alternately stacked to form three photodiodes PD1, PD2, and PD3. The three photodiodes PD1, PD2, and PD3 in order of distance from the multi filter 110, closest to furthest, may be referred to as the first photodiode PD1, the second photodiode PD2, and the third photodiode PD3.

Light detection characteristics of the first to third photodiodes PD1, PD2, and PD3 may be substantially the same as those of the first to third sub detectors 202, 204, and 206, respectively. The first photodiode PD1, the second photodiode PD2, and the third photodiode PD3 may generate a first channel signal, a second channel signal, and a third channel signal, respectively. The first to third photodiodes PD1, PD2, and PD3 may provide first to third channel signals to the spectroscopic processor 300. The spectroscopic processor 300 may generate information about intensities of light having different wavelengths based on the first to third channel signals.

The light blocking layer ST may be provided on the side of the multi detector 210. The light blocking layer ST may prevent the multi detector 210 from detecting unwanted light. The light blocking layer ST may include a material that blocks light. For example, the light blocking layer ST may include amorphous silicon or amorphous germanium.

The multi filter 110 may be provided on the multi detector 210. The light transmission characteristics of the multi filter 110 may be substantially the same as the light transmission characteristics of the multi filter 110 described with reference to FIGS. 2 to 5. The multi filter 110 may include a plurality of sub filters 112, 114, and 116. The first sub filter 112, the second sub filter 114, and the third sub filter 116 are illustrated as an example. Light transmission characteristics of the first to third sub filters 112, 114, and 116 may be substantially the same as light detection characteristics of the first to third sub detectors 202, 204, and 206, respectively. The first to third sub filters 112, 114, and 116 may be arranged in series. For example, the third sub filter 116, the second sub filter 114, and the first sub filter 112 may be sequentially stacked from the side of the multi detector 210, which is opposite to the side of the substrate 1. However, the stacking order of the first to third sub filters 112, 114, and 116 is not limited. Positions of the first sub filter 112, the second sub filter 114, and the third sub filter 116 may be switched with each other.

The first to third sub filters 112, 114, and 116 may each include a distributed Bragg reflector filter (hereinafter, a DBR filter). For example, each of the first to third sub filters 112, 114, and 116 may include first refractive index layers and second refractive index layers that are alternately stacked. The first refractive index layers and the second refractive index layers may have different refractive indices. For example, the first refractive index layers and the second refractive index layers may each include $SiO_2$ and $TiO_2$. For example, the first refractive index layers and the second refractive index layers may each include $SiO_2$ and $Si_3N_4$. The DBR filter may adjust transmission characteristics according to thicknesses of the first and second refractive index layers. The thicknesses of the first refractive index layers and the second refractive index layers of the first sub filter 112, the thicknesses of the first refractive index layers and the second refractive index layers of the second sub filter 114, and the thicknesses of the first refractive index layers and the second refractive index layers of the third sub filter 116 may be different from each other. For example, the thicknesses of the first refractive index layers and the second refractive index layers of the first sub filter 112, the thicknesses of the first refractive index layers and the second refractive index layers of the second sub filter 114, and the thicknesses of the first refractive index layers and the second refractive index layers of the third sub filter 116 may be determined to have light transmission spectra required by each of the sub filters 112, 114, and 116.

A micro lens ML may be provided on the multi filter 110. The micro lens ML may receive the incident light IL and collect the incident light IL in the multi filter 110. For example, the micro lens ML may refract the incident light IL.

The present disclosure may provide the hyperspectral element 12 having a high resolution and a broadband characteristic.

Figure 7:
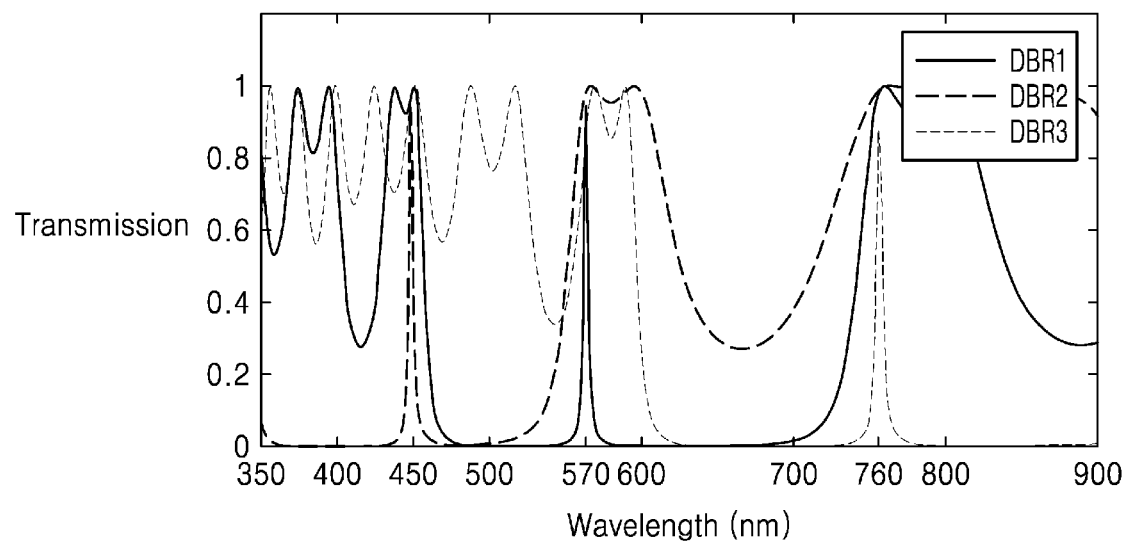
FIG. 7 is a light transmission spectrum graph of first to third sub filters of FIG. 6.
Figure 8:
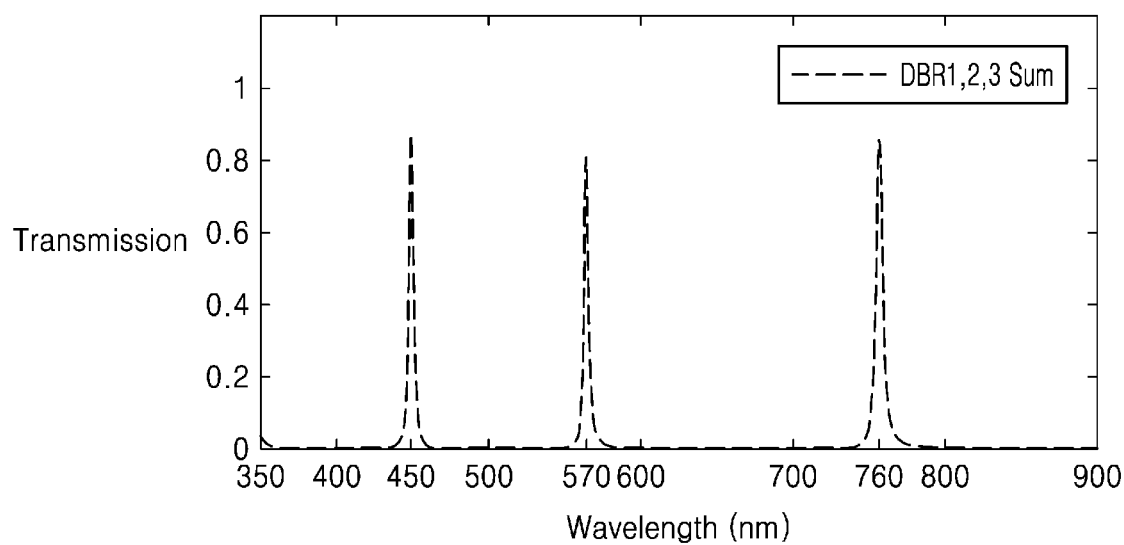
FIG. 8 is a light transmission spectrum of a multi filter of FIG. 6.

FIG. 7 is a light transmission spectrum graph of the first to third sub filters 112 to 116 of FIG. 6. FIG. 8 is a light transmission spectrum of the multi filter 110 of FIG. 6.

Referring to FIG. 7, a first light transmission spectrum DBR1 of the first sub filter 112, a second light transmission spectrum DBR2 of the second sub filter 114, and a third light transmission spectrum DBR3 of the third sub filter 116 may be provided. Referring to the first light transmission spectrum DBR1, a pass wavelength may be about 570 nanometers (nm), and a use band is about 490 nanometers (nm) to about 470 nanometers (nm) to about 720 nanometers (nm). Referring to the second light transmission spectrum DBR2, the pass wavelength may be about 450 nanometers (nm), and the use band is about 350 nanometers to about 550 nanometers (nm). Referring to the third light transmission spectrum DBR3, the pass wavelength may be about 760 nanometers (nm), and the use band is about 600 nanometers (nm) to about 900 nanometers (nm).

Referring to FIG. 8, a light transmission spectrum SS of the multi filter 110 configured by a combination of the first to third sub filters 112, 114, and 116 may be provided. The light transmission spectrum SS of the multi filter 110 may be determined according to light transmission spectra DBR1, DBR2, and DBR3 of the first to third sub filters 112, 114, and 116. For example, with respect to a specific wavelength in which a transmission value is 0 in the first light transmission spectrum DBR1, even though the transmission value is not 0 in the second light transmission spectrum DBR2 and the third light transmission spectrum DBR3, the transmission value in the light transmission spectrum SS of the multi filter 110 may be 0.

The band used for the first light transmission spectrum DBR1, the band used for the second light transmission spectrum DBR2, and the band used for the third light transmission spectrum DBR3 may be successive wavelength bands. Therefore, a final use band of the multi filter 110 is from about 350 nanometers (nm) which is a lower limit of the use band of the second light transmission spectrum DBR2 to about 900 nanometers (nm) which is an upper limit of the use band of the third light transmission spectrum DBR3. A transmission wavelength of the light transmission spectrum SS of the multi filter 110 may be about 450 nanometers (nm), about 570 nanometers (nm), and about 760 nanometers (nm).

Figure 9:
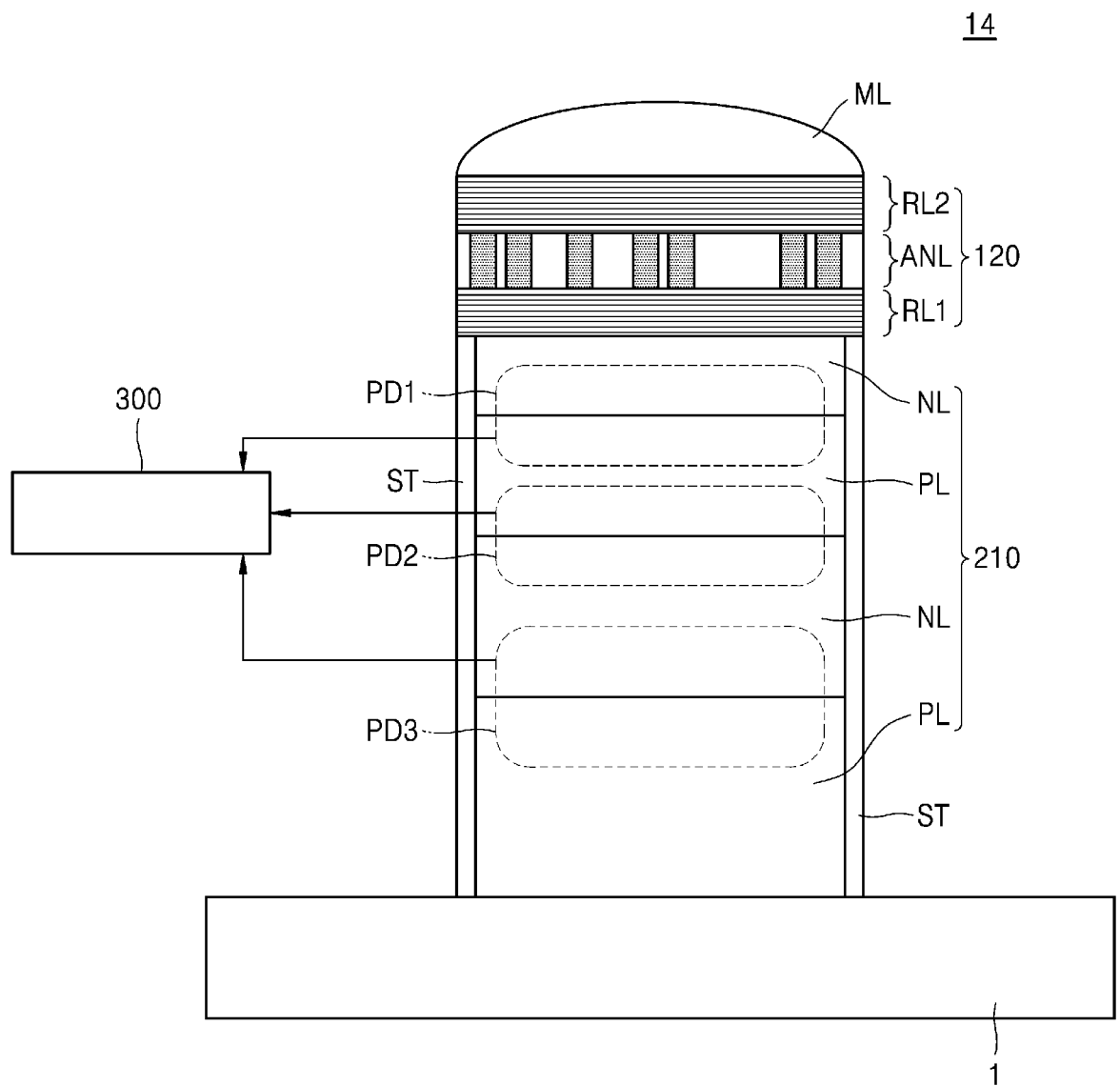
FIG. 9 is a cross-sectional view of a hyperspectral element according to an embodiment.

FIG. 9 is a cross-sectional view of a hyperspectral element 14 according to an embodiment. FIGS. 10 to 13 are perspective views of a multi filter 120 according to embodiments of the hyperspectral element 14 of FIG. 9. For the sake of brevity, substantially the same description as those given with reference to FIG. 6 may not be given.

Referring to FIG. 9, the hyperspectral element 14 may be provided. The hyperspectral element 14 may include the substrate 1, the multi detector 210, the light blocking layer ST, the multi filter 120, the micro lens ML, and the spectroscopic processor 300. The substrate 1, the multi detector 210, the light blocking layer ST, the micro lens ML, and the spectroscopic processor 300 may be substantially the same as those described with reference to FIG. 6.

The light transmission characteristics of the multi filter 120 may be substantially the same as the light transmission characteristics of the multi filter 100 described with reference to FIGS. 2 to 5. The multi filter 120 may include a first reflective layer RL1, a second reflective layer RL2, and an asymmetric nanostructure layer ANL provided between the first reflective layer RL1 and the second reflective layer RL2.

Each of the first reflective layer RL1 and the second reflective layer RL2 may be a DBR layer. For example, the first reflective layer RL1 and the second reflective layer RL2 may be substantially the same DBR layer. The first reflective layer RL1 and the second reflective layer RL2 may have substantially the same light reflective characteristics.

The asymmetric nanostructure layer ANL may include a plurality of nanostructures arranged asymmetrically. The asymmetric nanostructure layer ANL may transmit light having a plurality of wavelengths within a use band of the multi filter 120 determined by the first and second reflective layers RL1 and RL2.

Hereinafter, examples of a multi filter including the asymmetric nanostructure layer ANL will be described with reference to FIGS. 10 to 13.

Figure 10:
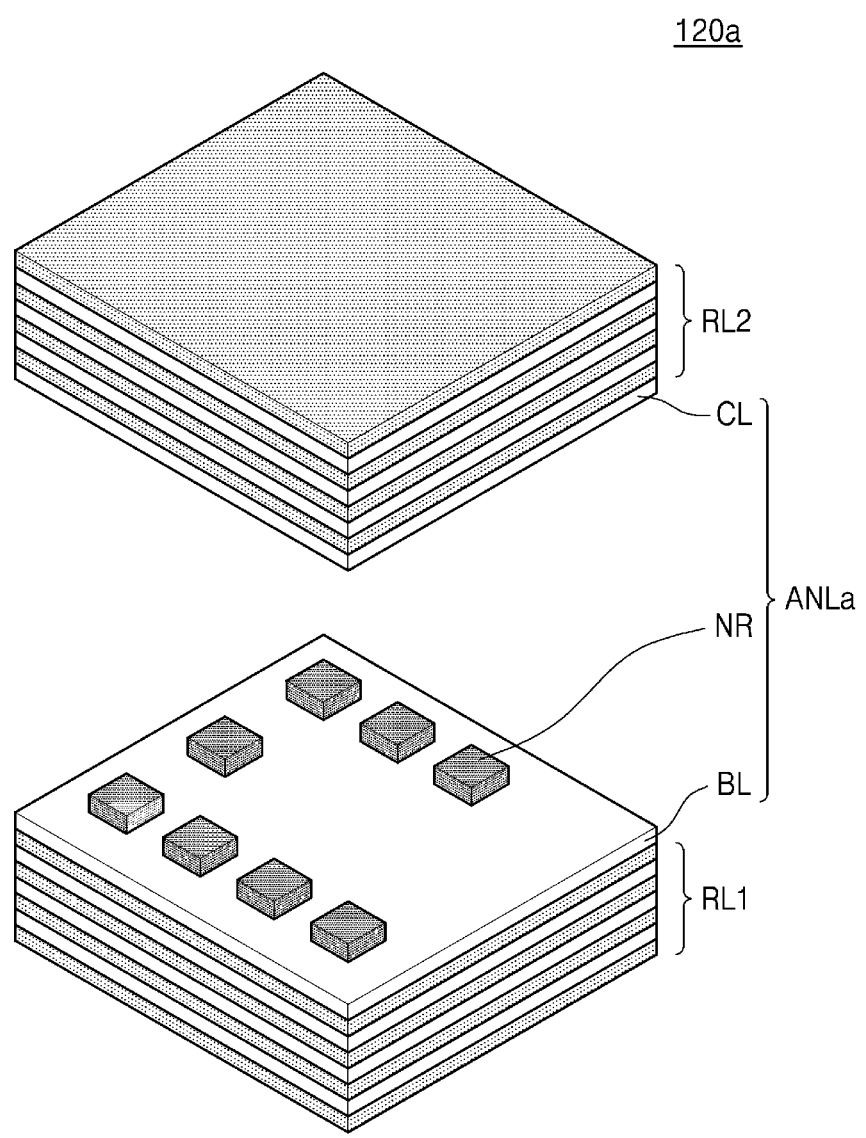
FIGS. 10-13 are perspective views of a multi filter according to an embodiment of the hyperspectral element of FIG. 9.

Referring to FIG. 10, a multi filter 120a including the first reflective layer RL1, the second reflective layer RL2, and an asymmetric nanostructure layer ANLa may be provided. The asymmetric nanostructure layer ANLa may include a base layer BL, a plurality of nano rods NR, and a capping layer CL. The base layer BL may be provided on the first reflective layer RL1. For example, the base layer BL may include any one of a polymer such as PC, PS, and PMMA, or $SiO_2$.

The plurality of nano rods NR may be asymmetrically arranged on the base layer BL. For example, based on a virtual line extending along a direction parallel to an upper surface of the base layer BL but passing through a center point of the upper surface of the base layer BL, an arrangement shape and/or the number of nano rods NR arranged on both sides of the virtual line may be different from each other. Widths of the plurality of nano rods NR may be less than the wavelength of incident light incident on the asymmetric nanostructure layer ANL. Distances between the plurality of nano rods NR and widths of the plurality of nano rods NR may be determined to have a transmission spectrum required by the multi filter 120a. Although a plurality of nano rods NR having a rectangular column shape are disclosed, the shape of the plurality of nano rods NR is not limited thereto. In another example, the plurality of nano rods NR may have a circular column shape, a polygonal column shape, a hemispherical shape, or a polyhedral shape other than a polygonal column. The plurality of nano rods NR may include a material having a refractive index greater than that of the base layer BL. For example, the plurality of nano rods NR may include any one of single crystal silicon, polysilicon (Poly Si), amorphous silicon (amorphous Si), Si3N4, GaP, $TiO_2$, AlSb, AlAs, AlGaAs, AlGaInP, BP, and $ZnGeP_2$.

The capping layer CL may be provided on the base layer BL and the plurality of nano rods NR. The capping layer CL may include a material having a refractive index smaller than that of the plurality of nano rods NR. For example, the capping layer CL may include any one of a polymer such as PC, PS, and PMMA, and $SiO_2$.

Figure 11:
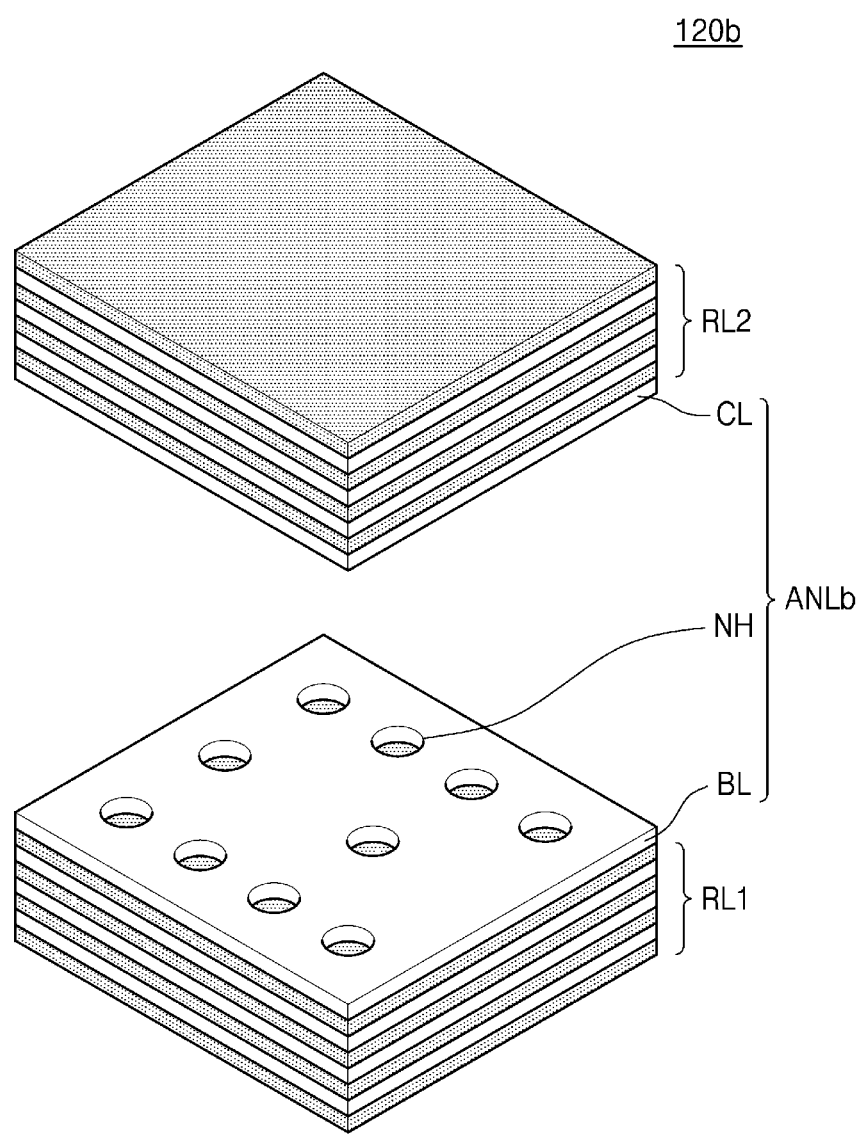

Referring to FIG. 11, a multi filter 120b including the first reflective layer RL1, the second reflective layer RL2, and an asymmetric nanostructure layer ANLb may be provided. The asymmetric nanostructure layer ANLb may include the base layer BL, a plurality of nano holes NH, and the capping layer CL. Unlike described with reference to FIG. 9, the plurality of nano holes NH may be provided in the base layer BL. The plurality of nano holes NH may penetrate through the base layer BL. For example, the plurality of nano holes NH may extend along a direction perpendicular to the upper surface of the base layer BL. The plurality of nano holes NH may be asymmetrically arranged. For example, based on a virtual line extending along a direction parallel to the upper surface of the base layer BL but passing through the center point of the upper surface of the base layer BL, an arrangement shape and/or the number of nano holes NH arranged on both sides of the virtual line may be different from each other. The widths of the plurality of nano holes NH may be less than the wavelength of incident light incident on the asymmetric nanostructure layer ANLb. Distances between the plurality of nano holes NH and widths of the plurality of nano holes NH may be determined to have a transmission spectrum required by the multi filter 120b. The plurality of nano holes NH having a circular column shape are disclosed, but the shape of the plurality of nano holes NH is not limited thereto. In another example, the plurality of nano holes NH may have a polygonal column shape, a hemispherical shape, or a polyhedral shape other than a polygonal column.

The capping layer CL may be provided on the base layer BL. The material of the base layer BL and the material of the capping layer CL may be substantially the same as those described with reference to FIG. 8.

Figure 12:
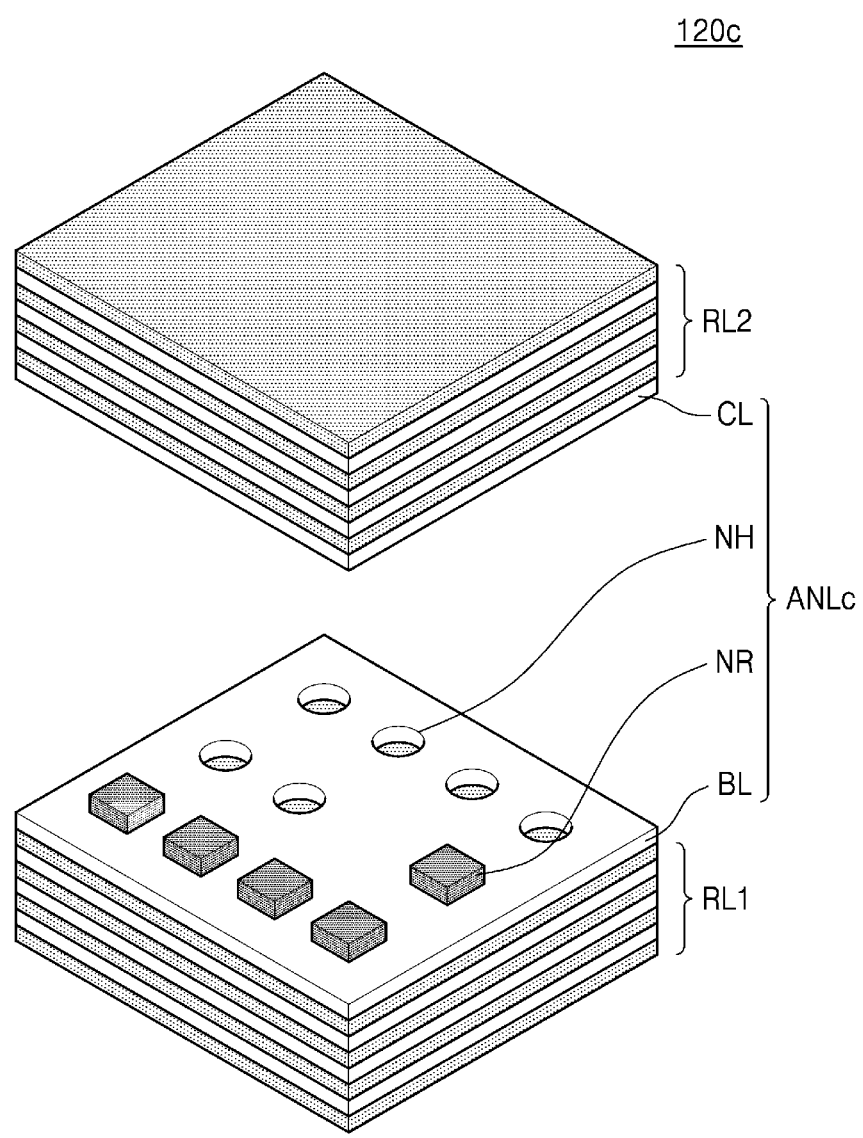

Referring to FIG. 12, a multi filter 120c including the first reflective layer RL1, the second reflective layer RL2, and an asymmetric nanostructure layer ANLc may be provided. The asymmetric nanostructure layer ANLc may include the base layer BL, the plurality of nano rods NR, the plurality of nano holes NH, and the capping layer CL. Unlike those described with reference to FIGS. 9 and 10, the plurality of nano rods NR and the plurality of nano holes NH may be provided together. The plurality of nano rods NR and the plurality of nano holes NH may be asymmetrically arranged. The base layer BL, the plurality of nano rods NR, the plurality of nano holes NH, and the capping layer CL may be substantially the same as those described with reference to FIGS. 9 and 10.

Figure 13:
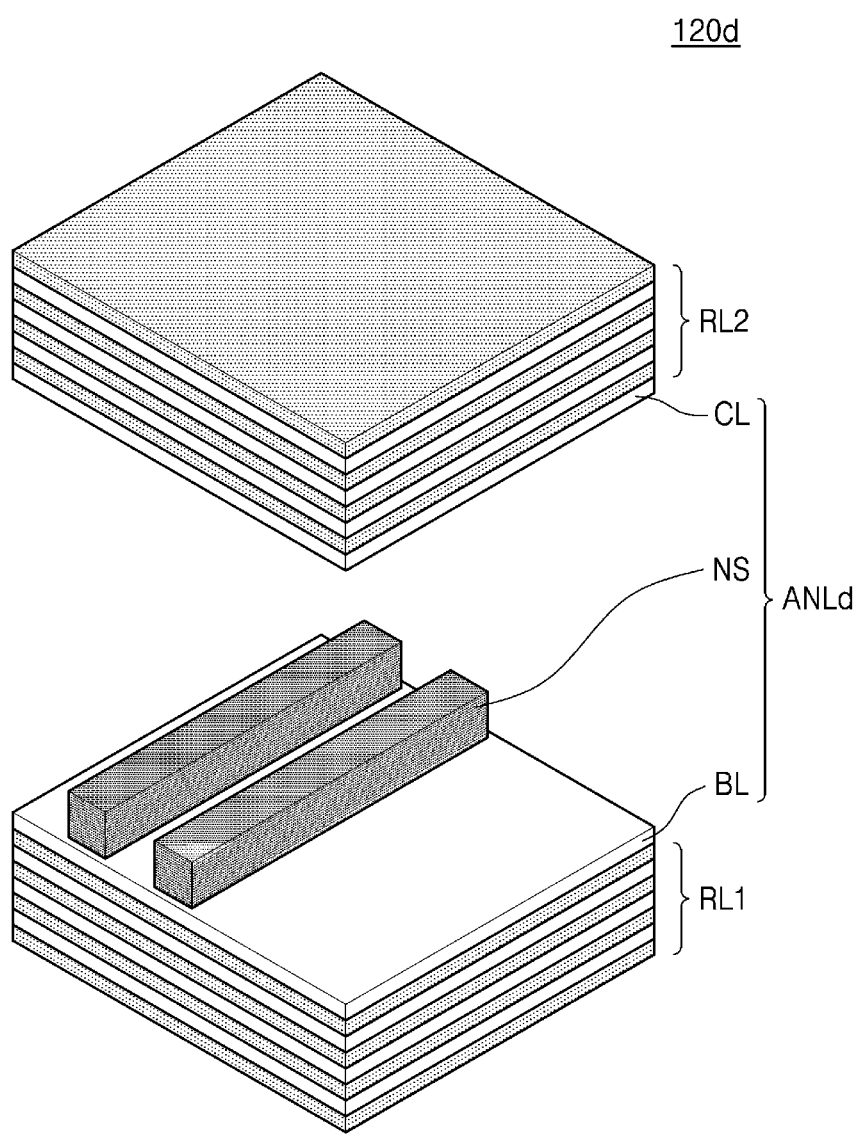

Referring to FIG. 13, a multi filter 120d including the first reflective layer RL1, the second reflective layer RL2, and an asymmetric nanostructure layer ANLd may be provided. The asymmetric nanostructure layer ANLd may include the base layer BL, a plurality of nano stripes NS, and the capping layer CL. The base layer BL and the capping layer CL may be substantially the same as those described with reference to FIG. 8. The plurality of nano stripes NS may be provided on the base layer BL. The plurality of nano stripes NS may be asymmetrically arranged on the base layer BL. For example, based on a virtual line extending along a direction parallel to the upper surface of the base layer BL but passing through the center point of the upper surface of the base layer BL, an arrangement shape and/or the number of nano stripes NS arranged on both sides of the virtual line may be different from each other. The plurality of nano stripes NS may extend in a first direction DR1 parallel to the upper surface of the base layer BL. Widths of the plurality of nano stripes NS may be less than the wavelength of incident light incident on the asymmetric nano structure layer ANLd. The hyperspectral element 14 of the present disclosure may have a high resolution.

Figure 14:
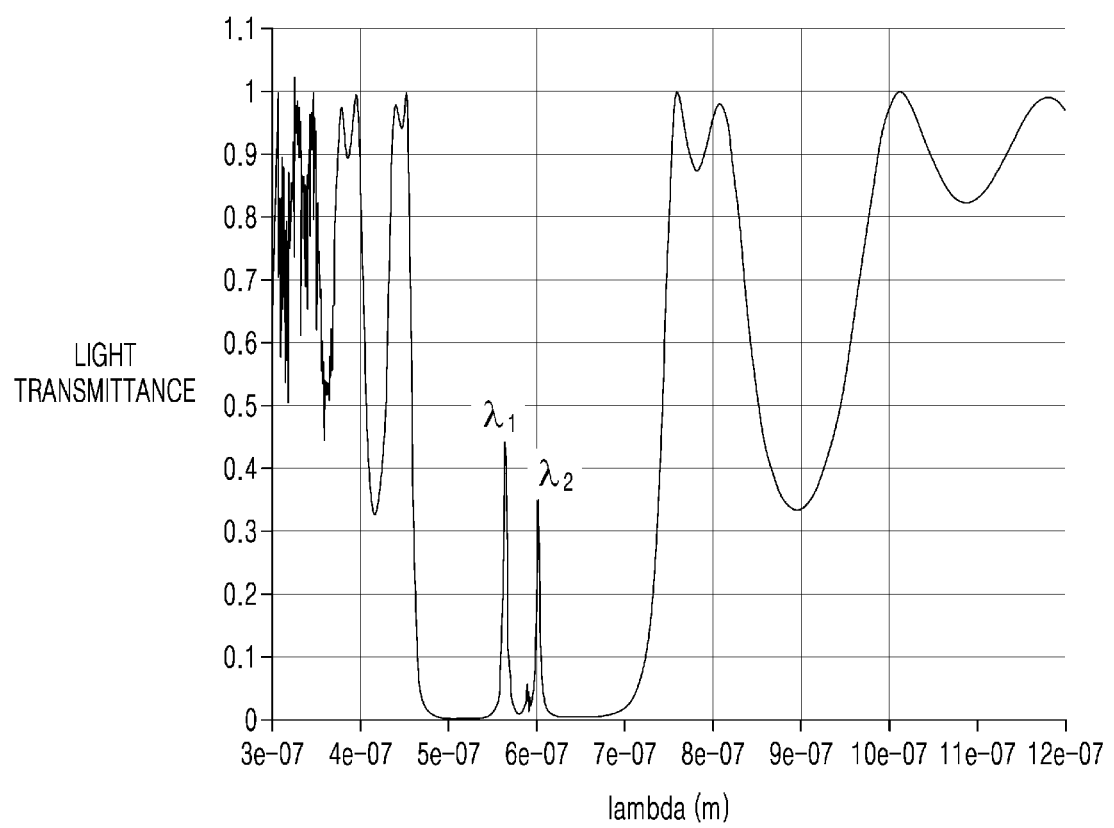
FIG. 14 is a light transmission spectrum of a multi filter of FIG. 9.

FIG. 14 is a light transmission spectrum of a multi filter of FIG. 9.

Referring to FIG. 14, a light transmission spectrum of the multi filter may have a first pass wavelength λ1 and a second pass wavelength λ2. The first pass wavelength λ1 may be about 580 nanometers (nm), and the second pass wavelength λ2 may be about 600 nanometers (nm). A use band of the light transmission spectrum of the multi filter may be about 490 nanometers (nm) to about 680 nanometers (nm).

Figure 15:
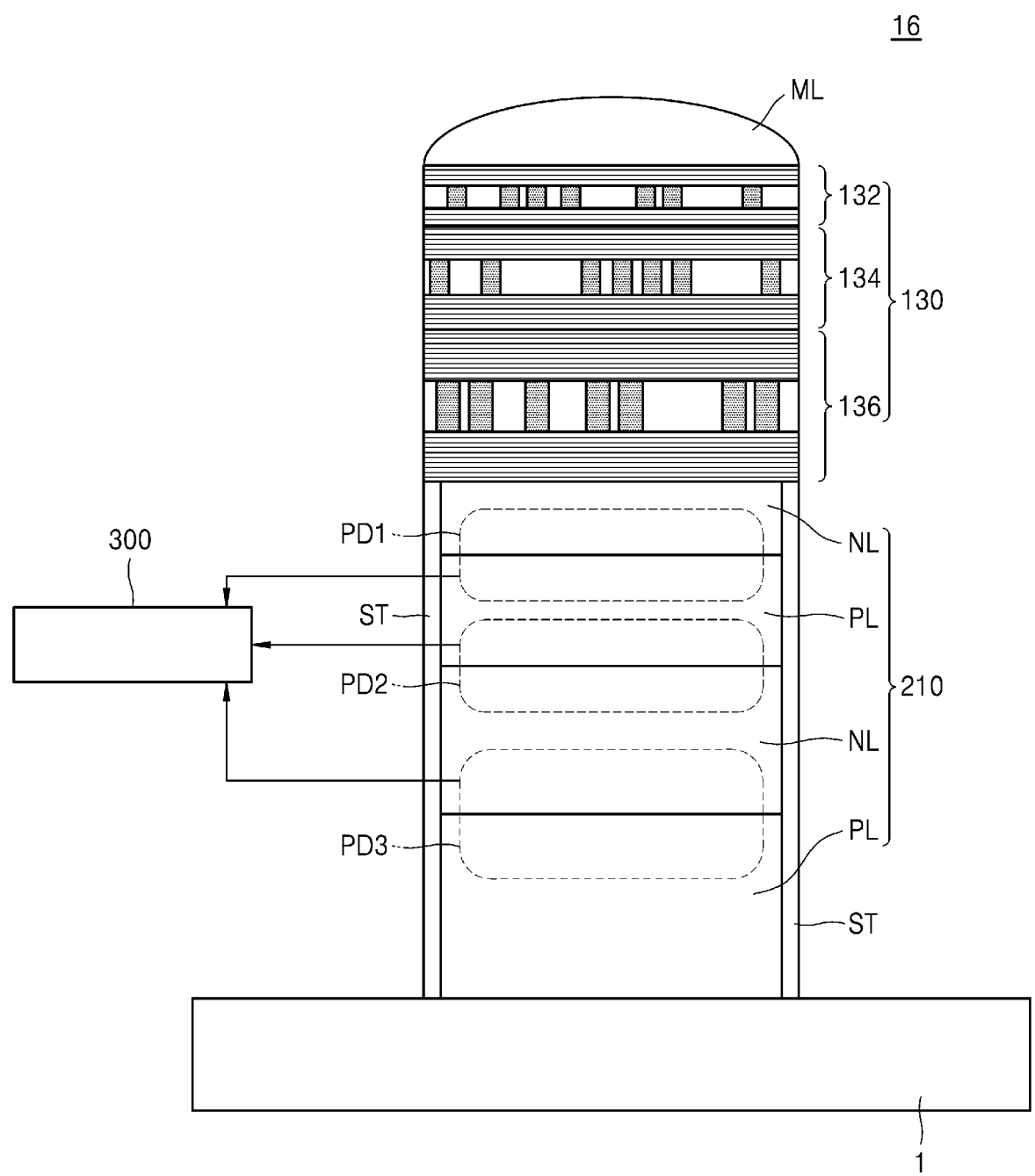
FIG. 15 is a cross-sectional view of a hyperspectral element according to an embodiment.

FIG. 15 is a cross-sectional view of a hyperspectral element 16 according to an embodiment. For brevity of description, descriptions that are substantially the same as described with reference to FIGS. 5 and 8 may not be given.

Referring to FIG. 15, the hyperspectral element 16 may be provided. The hyperspectral element 16 may include the substrate 1, the multi detector 210, the light blocking layer ST, the multi filter 130, the micro lens ML, and the spectroscopic processor 300. The substrate 1, the multi detector 210, the light blocking layer ST, the micro lens ML, and the spectroscopic processor 300 may be substantially the same as those described with reference to FIG. 6.

The multi filter 130 may include a first sub filter 132, a second sub filter 134, and a third sub filter 136. Each of the first to third sub filters 132, 134, and 136 may be substantially the same as the multi filter including the asymmetric nano structure layer ANL described with reference to FIG. 9. The first to third sub filters 132, 134 and 136 may be arranged in series. The first to third sub filters 132, 134, and 136 may have different heights. For example, the farther the sub filter 132, 134, or 136 is located from the micro lens ML, the taller the height of the sub filter 132, 134, and 136. The first to third sub filters 132, 134, and 136 may have different light transmission spectra. For example, the light transmission spectrum of the first sub filter 132 may include the first use band UB1 of the first sub filter 112 described with reference to FIG. 4 while including two pass wavelengths (for example, within the first use band UB1) as shown in FIG. 14. The light transmission spectrum of the second sub filter 134 may include the second use band UB2 of the second sub filter 114 described with reference to FIG. 4, while including two pass wavelengths (for example, within the second use band UB2) as shown in FIG. 14. The light transmission spectrum of the third sub filter 136 may include the third use band UB3 of the third sub filter 116 described with reference to FIG. 4, while including two pass wavelengths (for example, within the third use band UB3) as shown in FIG. 14.

The hyperspectral element 16 of the present disclosure may have a broadband characteristic and a high resolution characteristic.

Figure 16:
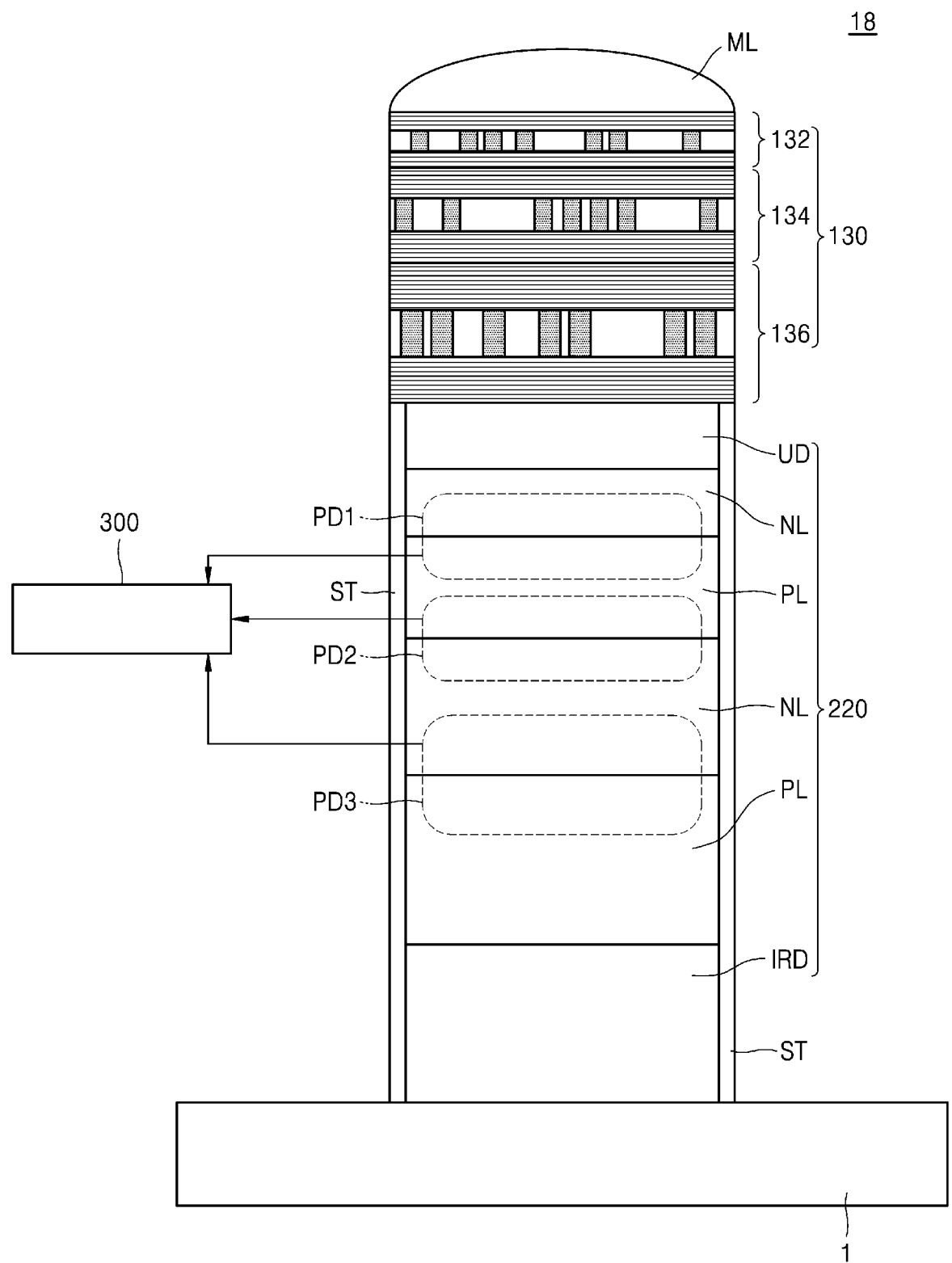
FIG. 16 is a cross-sectional view of a hyperspectral element according to an embodiment.

FIG. 16 is a cross-sectional view of a hyperspectral element 18 according to an embodiment. For brevity of description, descriptions that are substantially the same as described with reference to FIGS. 6 and 15 may not be given.

Referring to FIG. 16, the hyperspectral element 18 may be provided. The hyperspectral element 18 may include the substrate 1, the multi detector 220, the light blocking layer ST, the multi filter 130, the micro lens ML, and the spectroscopic processor 300. The substrate 1, the light blocking layer ST, the micro lens ML, and the spectroscopic processor 300 may be substantially the same as the substrate 1, the light blocking layer ST, the micro lens ML, and the spectroscopic processor 300 respectively described with reference to FIG. 6. The multi filter 130 may be substantially the same as the multi filter 130 described with reference to FIG. 15.

Unlike described with reference to FIG. 6, the multi detector 220 may further include an ultraviolet detector UD and an infrared detector IRD. For example, the ultraviolet detector UD may be provided between a stack structure of p layers PL and n layers NL and the multi filter 110, and the infrared detector IRD may be provided between the stack structure of p layers PL and n layers NL and the substrate 1.

The present disclosure may measure light in a visible region, an ultraviolet region, and an infrared region, and provide the hyperspectral element 18 having the broadband characteristic and the high resolution characteristic.

Figure 17:
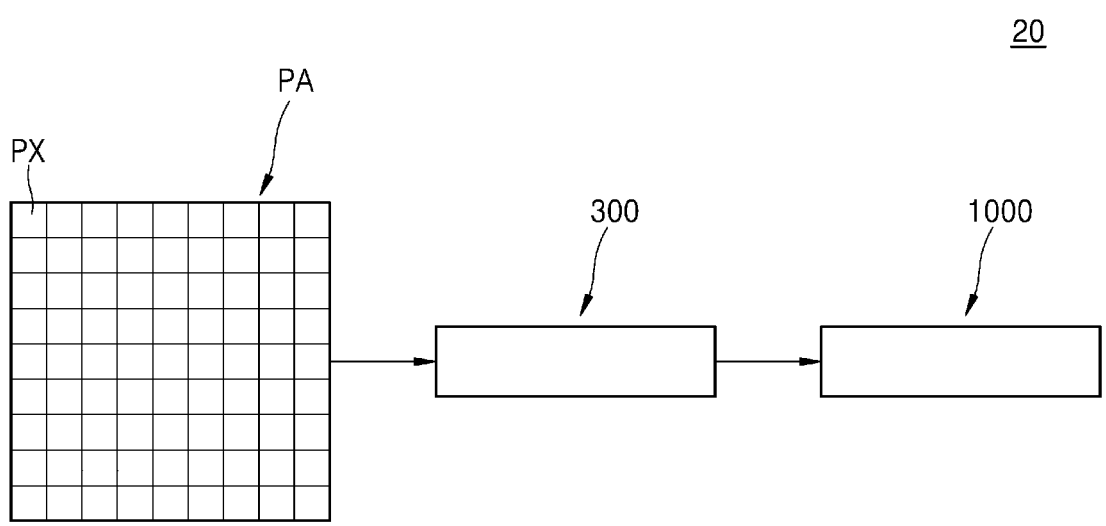
FIG. 17 is a block diagram of a hyperspectral sensor according to an embodiment.
Figure 18:
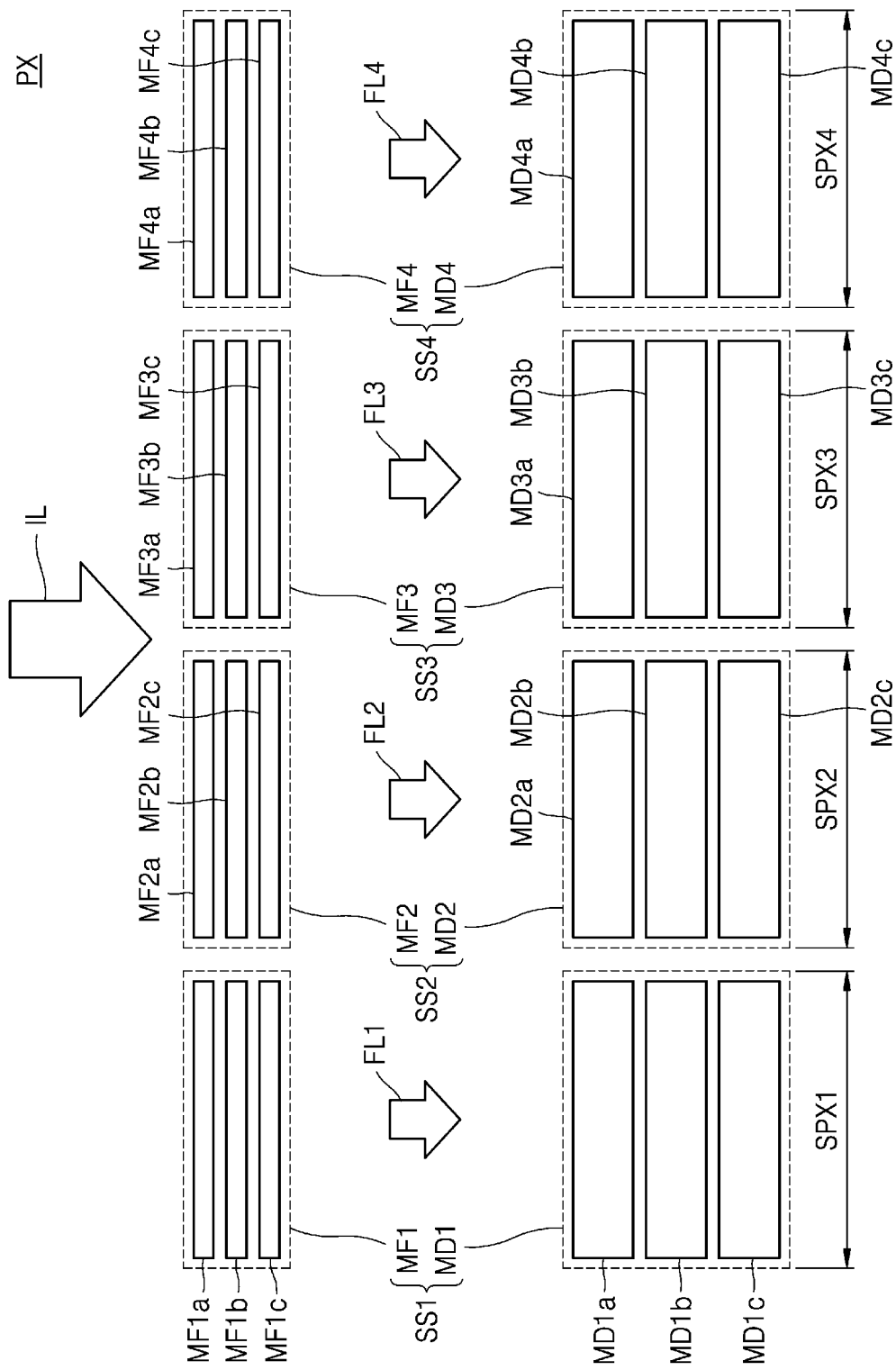
FIG. 18 is a block conceptual diagram of a pixel of FIG. 17.
Figure 19:
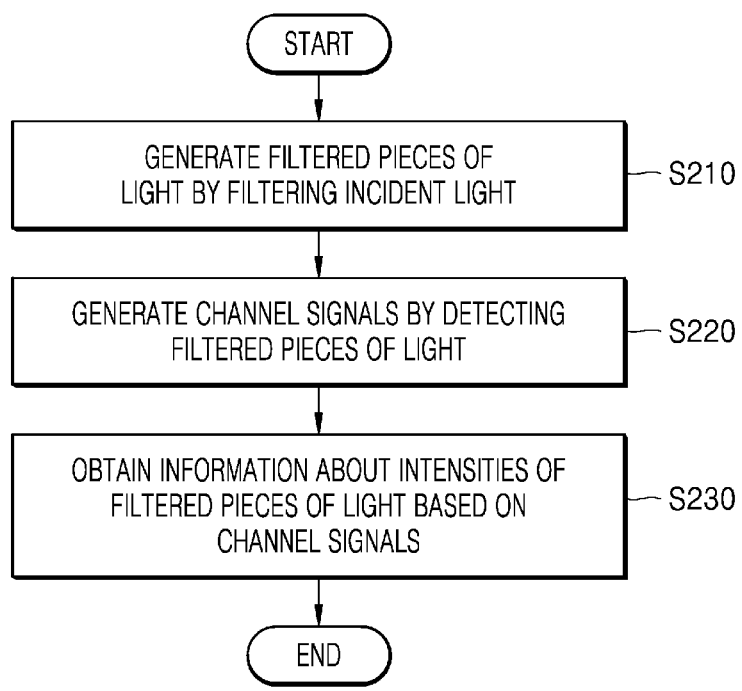
FIG. 19 is a flowchart illustrating a method of measuring light using the hyperspectral sensor of FIG. 17.
Figure 20:
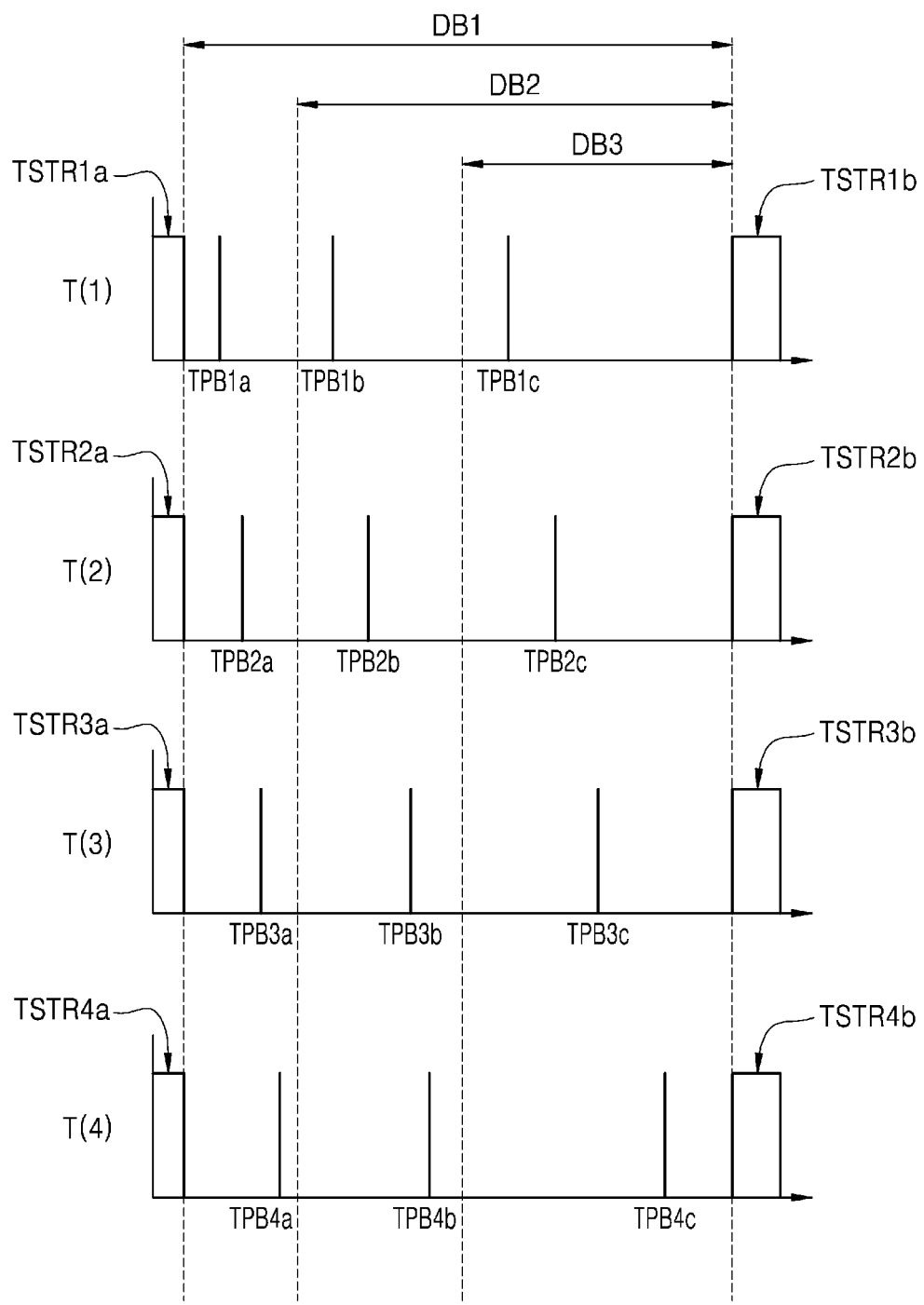
FIG. 20 are graphs of light transmission spectra of multi filters of FIG. 18.

FIG. 17 is a block diagram of a hyperspectral sensor 20 according to an embodiment. FIG. 18 is a block conceptual diagram of a pixel of FIG. 17. FIG. 19 is a flowchart illustrating a method of measuring light using the hyperspectral sensor 20 of FIG. 17. FIG. 20 shows graphs of light transmission spectra of multi filters of FIG. 18. For the sake of brevity, descriptions that are substantially the same as those described with reference to FIGS. 2 to 5 may not be given.

Referring to FIGS. 17 to 20, the hyperspectral sensor 20 may be provided. The hyperspectral sensor 20 may include a pixel array PA, the spectroscopic processor 300, and a main processor 1000. The pixel array PA may include a plurality of pixels PX. The plurality of pixels PX may be arranged in the pixel array PA. The plurality of pixels PX may be substantially identical to each other.

As illustrated in FIG. 18, each of the plurality of pixels PX may include a plurality of sub pixels SPX1, SPX2, SPX3, and SPX4. For example, the plurality of sub pixels SPX1, SPX2, SPX3, and SPX4 include the first sub pixel SPX1, the second sub pixel SPX2, the third sub pixel SPX3, and the fourth sub pixel SPX4. However, the number of sub pixels SPX1, SPX2, SPX3, and SPX4 is not limited. In another example, one pixel PX may include less or more than four sub pixels.

A first hyperspectral element SS1, a second hyperspectral element SS2, a third hyperspectral element SS3, and a fourth hyperspectral element SS4 may be respectively provided to the first to fourth sub pixels SPX1, SPX2, SPX3, and SPX4. The first to fourth hyperspectral elements SS1, SS2, SS3, and SS4 may respectively include a first multi detector MD1, a second multi detector MD2, a third multi detector MD3, and a fourth multi detector MD4. Each of the first to fourth multi detectors MD1, MD2, MD3, and MD4 may correspond to the multi detector 200 of FIG. 2 described with reference to FIGS. 2 to 5. The first to fourth multi detectors MD1, MD2, MD3, and MD4 may be substantially the same as each other. The first to fourth multi detectors MD1, MD2, MD3, and MD4 may have the same light detection characteristics. For example, each of the first to fourth multi detectors MD1, MD2, MD3, and MD4 may be substantially the same as the multi detector 200 described with reference to FIG. 2. Each of the first to fourth multi detectors MD1, MD2, MD3, and MD4 may include a first sub detector that measures light having a wavelength in the first light detection band DB1, a second sub detector that measures light having a wavelength in the second light detection band DB2, and a third sub detector that measures light having a wavelength in the third light detection band DB3. The first to third light detection bands DB1, DB2, and DB3 may be substantially the same as those described with reference to FIGS. 2 to 5.

The first to fourth hyperspectral elements SS1, SS2, SS3, and SS4 may include respectively a first multi filter MF1, a second multi filter MF2, a third multi filter MF3, and a fourth multi filter MF4. The first to fourth multi filters MF1, MF2, MF3, and MF4 may be substantially the same as each other. The first to fourth multi filters MF1, MF2, MF3, and MF4 may have different light transmission characteristics. For example, each of the first to fourth multi filters MF1, MF2, MF3, and MF4 may include three sub filters described with reference to FIG. 2. The first to fourth multi filters MF1, MF2, MF3, and MF4 may filter the incident light IL to generate a first filtered light FL1, a second filtered light FL2, a third filtered light FL3, and a fourth filtered light FL4 respectively. (operation S210) The first to fourth filtered pieces of light FL1, FL2, FL3, and FL4 may have different spectra. Hereinafter, light transmission characteristics of the first to fourth multi filters MF1, MF2, MF3, and MF4 are described.

Graphs T(1) to T(4) of FIG. 20 may represent light transmission spectra of the first to fourth multi filters MF1, MF2, MF3, and MF4, respectively. Referring to the graph T(1), light having a 1a-th final pass wavelength TPB1a, light having a 1b-th final pass wavelength TPB1b, light having a 1c-th final pass wavelength TPB1c, light having a wavelength within a 1a-th sub light transmission region TSTR1a, and light having a wavelength within a 1b-th sub light transmission region TSTR1b may pass through the first multi filter MF1.

Referring to the graph T(2), light having a 2a-th final pass wavelength TPB2a, light having a 2b-th final pass wavelength TPB2b, light having a 2c-th final pass wavelength TPB2c, light having a wavelength within a 2a-th sub light transmission region TSTR2a, and light having a wavelength within a 2b-th sub light transmission region TSTR2b may pass through the second multi filter MF2.

Referring to the graph T(3), light having a 3a-th final pass wavelength TPB3*a*, light having a 3b-th final pass wavelength TPB3*b*, light having a 3c-th final pass wavelength TPB3*c*, light having a wavelength within a 3a-th sub light transmission region TSTR3*a*, and light having a wavelength within a 3b-th sub light transmission region TSTR3*b* may pass through the third multi filter MF3.

Referring to the graph T(4), light having a 4a-th final pass wavelength TPB4*a*, light having a 4b-th final pass wavelength TPB4*b*, light having a 4c-th final pass wavelength TPB4*c*, light having a wavelength within a 4a-th sub light transmission region TSTR4*a*, and light having a wavelength within a 4b-th sub light transmission region TSTR4*b* may pass through the fourth multi filter MF4.

The 1a-th final pass wavelength TPB1*a*, the 2a-th final pass wavelength TPB2*a*, the 3a-th final pass wavelength TPB3*a*, the 4a-th final pass wavelength TPB4*a*, the 1b-th final pass wavelength TPB1*b*, the 2b-th final pass wavelength TPB2*b*, the 3b-th final pass wavelength TPB3*b*, the 4b-th final pass wavelength TPB4*b*, the 1c-th final pass wavelength TPB1*c*, the 2c-th final pass wavelength TPB2*c*, the 3c-th final pass wavelength TPB3*c*, and the 4c-th final pass wavelength TPB4*c* may be different wavelengths located in the first light detection band DB1. The 1b-th final pass wavelength TPB1*b*, the 2b-th final pass wavelength TPB2*b*, the 3b-th final pass wavelength TPB3*b*, the 4b-th final pass wavelength TPB4*b*, the 1c-th final pass wavelength TPB1*c*, the 2c-th final pass wavelength TPB2*c*, the 3c-th final pass wavelength TPB3*c*, and the 4c-th final pass wavelength TPB4*c* may be different wavelengths located in the second light detection band DB2. The 1c-th final pass wavelength TPB1*c*, the 2c-th final pass wavelength TPB2*c*, the 3c-th final pass wavelength TPB3*c*, and the 4c-th final pass wavelength TPB4*c* may be different wavelengths located in the third light detection band DB3.

The first to fourth multi detectors MD1, MD2, MD3, and MD4 may detect filtered pieces of light to generate channel signals (operation S220). The first sub detector MD1*a* of the first multi detector MD1 may detect the 1a-th to 1c-th final pass wavelengths TBP1*a*, TPB1*b*, and TPB1*c* to generate a 1a-th channel signal. The first sub detector MD1*a* of the first multi detector MD1 may provide the 1a-th channel signal to the spectroscopic processor 300. The second sub detector MD1*b* of the first multi detector MD1 may detect the 1b-th and 1c-th final pass wavelengths TPB1*b* and TPB1*c* to generate a 1b-th channel signal. The second sub detector MD1*b* of the first multi detector MD1 may provide the 1b-th channel signal to the spectroscopic processor 300. The third sub detector MD1*c* of the first multi detector MD1 may sense the 1c-th final pass wavelength TBP1*c* to generate a 1c-th channel signal. The third sub detector MD1*c* of the first multi detector MD1 may provide the 1c-th channel signal to the spectroscopic processor 300.

The first sub detector MD2*a* of the second multi detector MD2 may detect the 2a-th to 2c-th final pass wavelengths TPB2*a*, TPB2*b*, and TPB2*c* to generate a 2a-th channel signal. The first sub detector MD2*a* of the second multi detector MD2 may provide the 2a-th channel signal to the spectroscopic processor 300. The second sub detector MD2*b* of the second multi detector MD2 may detect the 2b-th and 2c-th final pass wavelengths TPB2*b* and TPB2*c* to generate a 2b-th channel signal. The second sub detector MD2*b* of the second multi detector MD2 may provide the 2b-th channel signal to the spectroscopic processor 300. The third sub detector MD2*c* of the second multi detector MD2 may detect the 2c-th final pass wavelength TBP2*c* to generate a 2c-th channel signal. The third sub detector MD2*c* of the second multi detector MD2 may provide the 2c-th channel signal to the spectroscopic processor 300.

The first sub detector MD3*a* of the third multi detector MD3 may detect the 3a-th to 3c-th final pass wavelengths TPB3*a*, TPB3*b*, and TPB3*c* to generate a 3a-th channel signal. The first sub detector MD3*a* of the third multi detector MD3 may provide the 3a-th channel signal to the spectroscopic processor 300. The second sub detector MD3*b* of the third multi detector MD3 may detect the 3b-th and 3c-th final pass wavelengths TPB3*b* and TPB3*c* to generate a 3b-th channel signal. The second sub detector MD3*b* of the third multi detector MD3 may provide the 3b-th channel signal to the spectroscopic processor 300. The third sub detector MD3*c* of the third multi detector MD3 may detect the 3c-th final pass wavelength TBP3*c* to generate a 3c-th channel signal. The third sub detector MD3*c* of the third multi detector MD3 may provide the 3c-th channel signal to the spectroscopic processor 300.

The first sub detector MD4*a* of the fourth multi detector MD4 may detect the 4a-th to 4c-th final pass wavelengths TPB4*a*, TPB4*b*, and TPB4*c* to generate a 4a-th channel signal. The first sub detector MD4*a* of the fourth multi detector MD4 may provide the 4a-th channel signal to the spectroscopic processor 300. The second sub detector MD4*b* of the fourth multi detector MD4 may detect the 4b-th and 4c-th final pass wavelengths TPB4*b* and TPB4*c* to generate a 4b-th channel signal. The second sub detector MD4*b* of the fourth multi detector MD4 may provide the 4b-th channel signal to the spectroscopic processor 300. The third sub detector MD4*c* of the fourth multi detector MD4 may sense the 4c-th final pass wavelength TBP4*c* to generate a 4c-th channel signal. The third sub detector MD4*c* of the fourth multi detector MD4 may provide the 4c-th channel signal to the spectroscopic processor 300.

The spectroscopic processor 300 may generate information about intensities of the light having the 1a-th to 4c final pass wavelengths TBP1*a*, TBP1*b*, TBP1*c*, TBP2*a*, TBP2*b*, TBP2*c*, TBP3*a*, TBP3*b*, TBP3*c*, TBP4*a*, TBP4*b*, and TBP4*c* based on the 1a-th to 4c-th channel signals (operation S230). The spectroscopic processor 300 may provide the information about intensities of the light having the 1a-th to 4c final pass wavelengths TBP1*a*, TBP1*b*, TBP1*c*, TBP2*a*, TBP2*b*, TBP2*c*, TBP3*a*, TBP3*b*, TBP3*c*, TBP4*a*, TBP4*b*, and TBP4*c* to the main processor 1000.

The main processor 1000 may generate hyperspectral information based on information about the intensities of light. For example, the main processor 1000 may generate hyperspectral image information.

Light having three different wavelengths may be detected respectively from the first to fourth sub pixels SPX1, SPX2, SPX3, and SPX4. Lights having wavelengths within twelve wavelength bands may be detected from one pixel PX including the first to fourth sub pixels SPX1, SPX2, SPX3, and SPX4, When one sub pixel detects only light having one wavelength, n sub pixels are required to detect light having n wavelengths. In the field of hyperspectral sensors in which it is required to detect light of as many wavelengths as possible, when the number of sub pixels increases, an area per sub pixel decreases, and thus, the resolution may decrease.

The present disclosure may provide the hyperspectral sensor 20 including a sub pixel that detects pieces of light having a plurality of wavelengths. Because the present disclosure uses subpixels that are less than the number of wavelengths to be detected, a subpixel having a larger area than a case in which one subpixel detects only light having one wavelength may be provided. Accordingly, the hyperspectral sensor 20 having a high resolution may be provided.

The present disclosure may provide the hyperspectral sensor 20 having a broadband characteristic and a high resolution characteristic.

Figure 21:
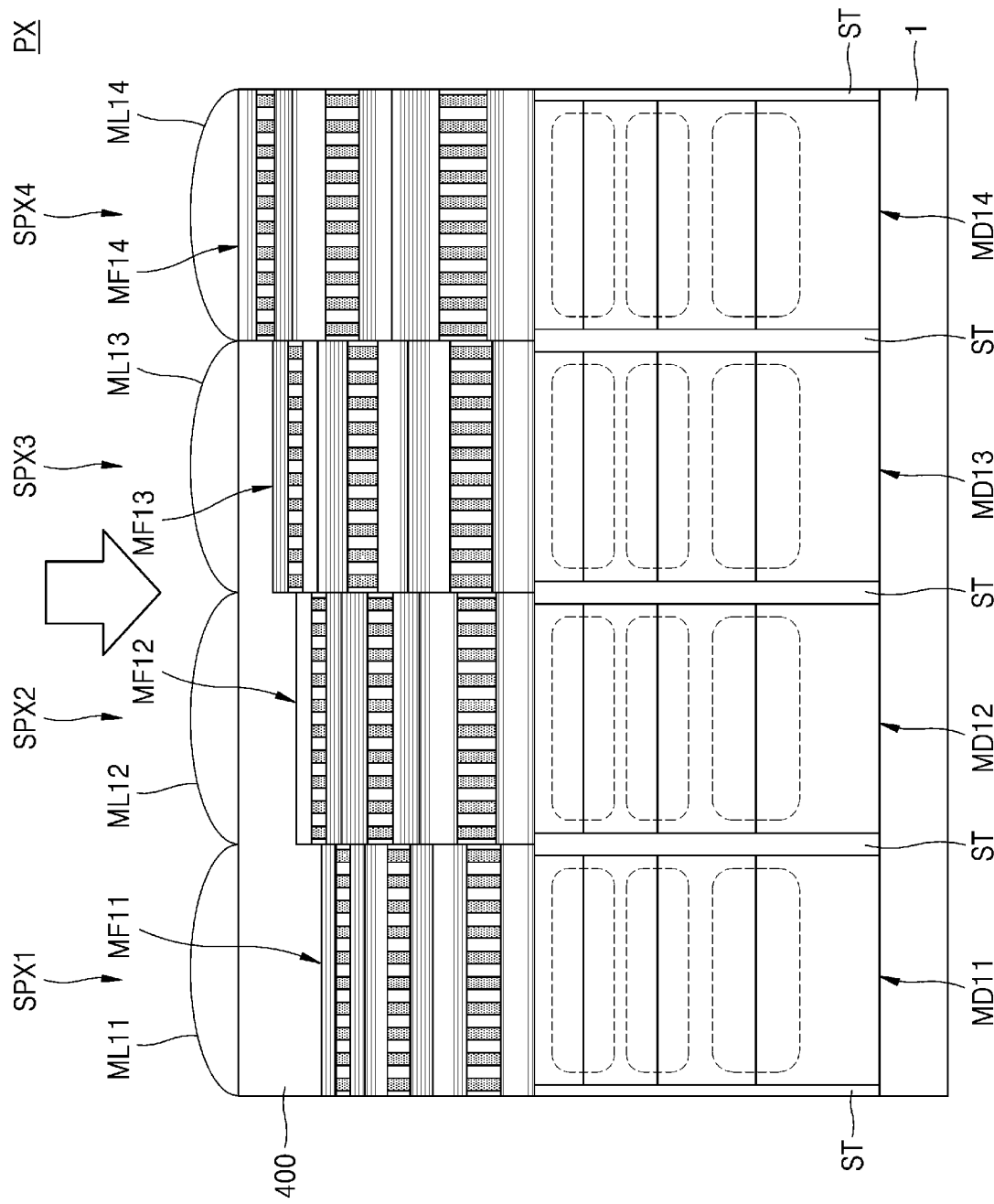
FIG. 21 is a cross-sectional view of a pixel according to an embodiment of the hyperspectral sensor of FIG. 17.

FIG. 21 is a cross-sectional view of a pixel according to an embodiment of the hyperspectral sensor 20 of FIG. 17. For the sake of brevity, descriptions that are substantially the same as those described with reference to FISG. 6 and 17 to 20 may not be given.

Referring to FIG. 21, the pixel PX of the hyperspectral sensor 20 may be provided. The pixel PX may include the substrate 1, first to fourth multi detectors MD11, MD12, MD13, and MD14, the light blocking layer ST, first to fourth multi filters MF11, MF12, MF13, and MF14, and first to fourth micro lenses ML. The substrate 1 may be substantially the same as that described with reference to FIG. 6.

The first to fourth multi detectors MD11, MD12, MD13, and MD14 may be provided on the substrate 1. Each of the first to fourth multi detectors MD11, MD12, MD13, and MD14 may be substantially the same as the multi detector 200 described with reference to FIG. 6. Light detection characteristics of the first to fourth multi detectors MD11, MD12, MD13, and MD14 may be substantially the same as light detection characteristics of the first to fourth multi detectors MD11, MD12, MD13, and MD14 respectively described with reference to FIGS. 18 to 20.

The light blocking layer ST may be provided on side surfaces of the first to fourth multi detectors MD11, MD12, MD13, and MD14. The light blocking layer ST may separate the first to fourth multi detectors MD11, MD12, MD13, and MD14 from each other. The light blocking layer ST may optically separate the first to fourth multi detectors MD11, MD12, MD13, and MD14 from each other such that the first to fourth multi detectors MD11, MD12, MD13, and MD14 do not detect light that is not required.

The first to fourth multi filters MF11, MF12, MF13, and MF14 may be provided on the first to fourth multi detectors MD11, MD12, MD13, and MD14, respectively. Each of the first to fourth multi filters MF11, MF12, MF13, and MF14 is shown in FIG. 21 may have substantially the same structure as the multi filter described with reference to FIG. 14, but this is not limiting. For example, the first to fourth multi filters MF11, MF12, MF13, and MF14 may have different heights, and asymmetric nanostructure layer ANLs of the first to fourth multi filters MF11, MF12, MF13, and MF14 have different heights. In another example, each of the first to fourth multi filters MF11, MF12, MF13, and MF14 may be the multi filter 110 of FIG. 5 or the multi filter 120 of FIG. 8. The light transmission characteristics of the first to fourth multi filters MF11, MF12, MF13, and MF14 may be substantially the same as the light transmission characteristics of the first to fourth multi filters MF1, MF2, MF3, and MF4 described with reference to FIGS. 16 to 19, respectively.

A planarization layer 400 may be provided on the first to fourth multi filters MF11, MF12, MF13, and MF14. An upper surface of the planarization layer 400 may be parallel to an upper surface of the substrate 1. For example, the planarization layer 400 may include $SiO_2$.

The first to fourth micro lenses ML11, ML12, ML13, and ML14 may be provided on the planarization layer 400. The first to fourth micro lenses ML11, ML12, ML13, and ML14 may be arranged to correspond to the first to fourth multi filters MF11, MF12, MF13, and MF14, respectively. The first to fourth micro lenses ML11, ML12, ML13, and ML14 may collect light to the first to fourth multi filters MF11, MF12, MF13, and MF14, respectively.

The present disclosure may provide the pixel PX including the plurality of sub pixels SPX1, SPX2, SPX3, and SPX4 that detect light having a plurality of wavelengths.

Figure 22:
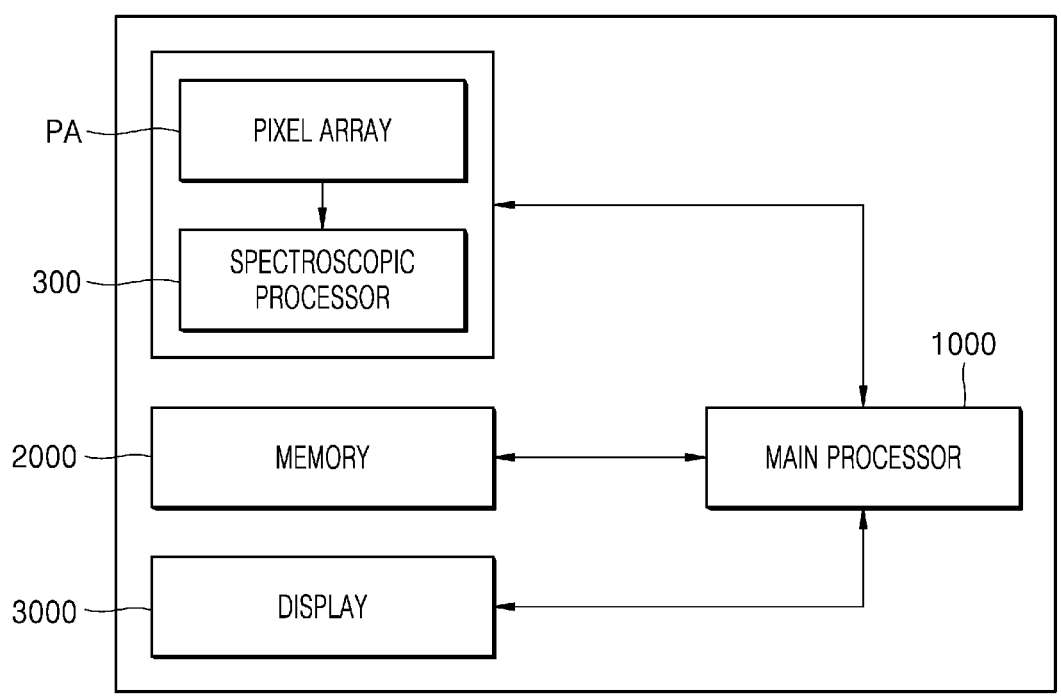
FIG. 22 is a block diagram of a hyperspectral image generating apparatus including a hyperspectral sensor according to an embodiment.

FIG. 22 is a block diagram of a hyperspectral image generating apparatus 30 including a hyperspectral sensor according to an embodiment. For the sake of brevity, descriptions that are substantially the same as those described with reference to FIGS. 17 to 21 may not be given.

Referring to FIG. 22, the hyperspectral image generating apparatus 30 may be provided. For example, the hyperspectral image generating apparatus 30 may be an image sensor. The hyperspectral image generating apparatus 30 may include the pixel array PA, the spectroscopic processor 300, the main processor 1000, a memory 2000, and a display 3000. The pixel array PA and the spectroscopic processor 300 may be referred to as a hyperspectral sensor unit 22. The pixel array PA and the spectroscopic processor 300 may be substantially the same as the pixel array PA and the spectroscopic processor 300 described with reference to FIGS. 16 to 20, respectively. The pixel array PA may receive incident light provided from a measurement target. The spectroscopic processor 300 may generate information about a position of the measurement target and the intensity of light for each wavelength. Information about the position of the measurement target and the intensity of light for each wavelength may be referred to as hyperspectral information. The spectroscopic processor 300 may provide the hyperspectral information to the main processor 1000. The main processor 1000 may generate hyperspectral image information based on the hyperspectral information obtained from the spectroscopic processor 300. The main processor 300 may provide the hyperspectral image information to the display 2000.

The display 2000 may output various types of information including the hyperspectral image information. For example, the display 2000 may display the hyperspectral image information, an operation state of the hyperspectral image generating apparatus 30, and a user interface window for selecting a function and option selected by a user.

The memory 3000 stores various data for the operation of the hyperspectral image generating apparatus 30 such as a program for processing or controlling the main processor 1000. For example, the memory 3000 may store a plurality of application programs driven by the hyperspectral image generating apparatus 30 and data and commands for the operation of the hyperspectral image generating apparatus 30. The memory 3000 may be accessed by the main processor 1000 and data read/write/modify/delete/update by the main processor 1000 may be performed. The memory 3000 may be implemented not only as a storage medium in the hyperspectral image generating apparatus 30, but also as an external storage medium, a removable disk including a USB memory, and a web server through a network.

The present disclosure may provide the hyperspectral image generating apparatus 30 including the hyperspectral sensor unit 22 having a high optical resolution and a wide use band.

Figure 23:
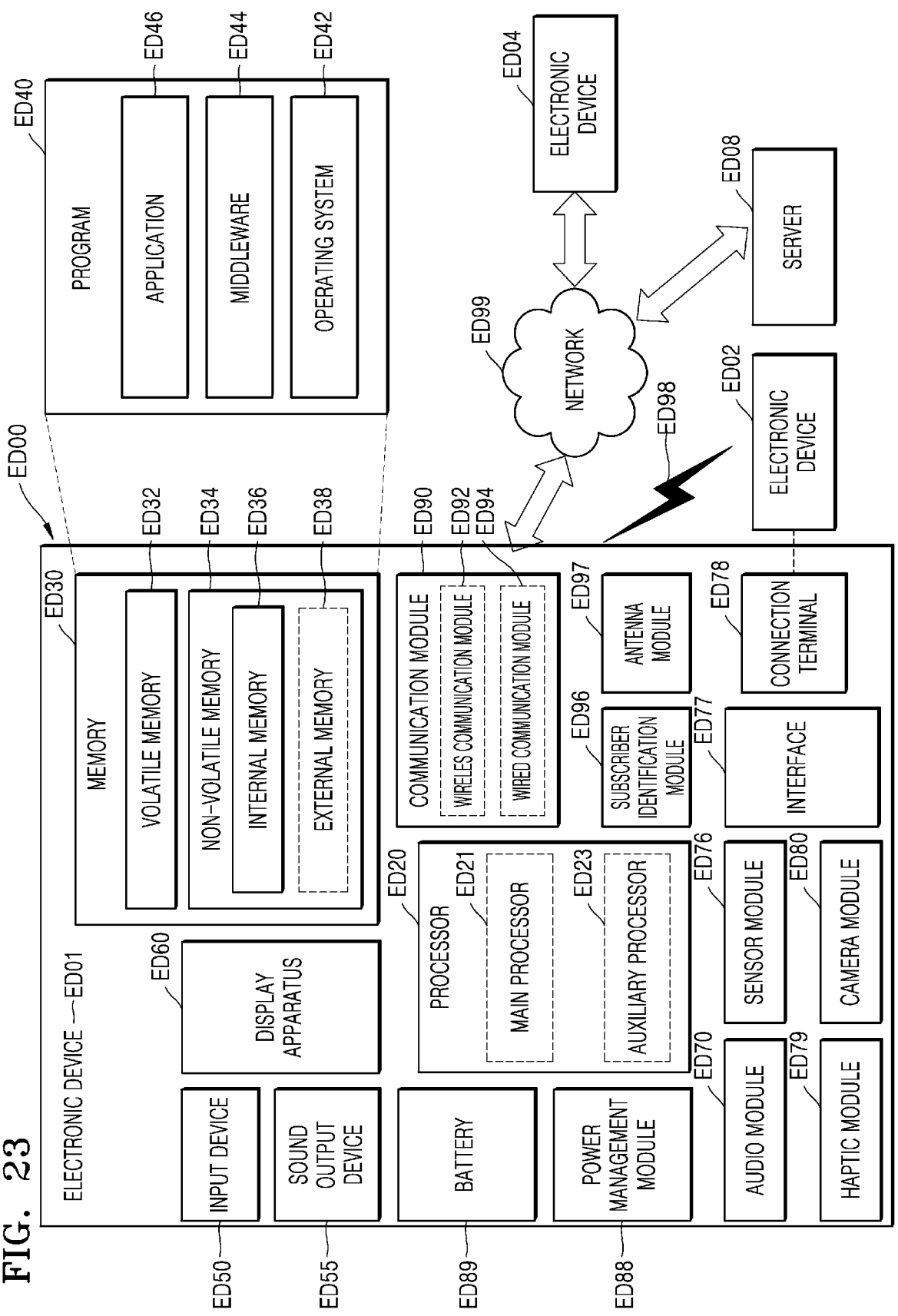
FIG. 23 is a block diagram of an example showing an electronic device including an image sensor.

FIG. 23 is a block diagram of an example showing an electronic device ED01 including an image sensor.

Referring to FIG. 23, in a network environment ED00, the electronic device ED01 may communicate with another electronic device ED02 through a first network ED98 (e.g., a short-range wireless communication network) or communicate with another electronic device ED04 and/or a server ED08 through a second network ED99 (e.g., a remote wireless communication network) The electronic device ED01 may communicate with the electronic device ED04 through the server ED08. The electronic device ED01 may include a processor ED20, a memory ED30, an input device ED50, a sound output device ED55, a display apparatus ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. The electronic device ED01 may omit some (e.g., the display apparatus ED60) of the components or may further include other components. One or more of the components may be implemented as an integrated circuit. For example, the sensor module ED76 (e.g., a fingerprint sensor, an iris sensor, an illumination sensor, etc.) may be embedded in the display apparatus ED60 (e.g., a display). In addition, when the image sensor 4000 includes a spectral function, some functions (a color sensor and an illuminance sensor) of the sensor module ED76 may be implemented in the image sensor 4000 itself rather than a separate sensor module.

The processor ED20 may be configured to execute software (e.g., a program ED40) to control one or a plurality of components (hardware or software components) of the electronic device ED01, the components being connected to the processor ED20, and to perform various data processing or calculations. As part of the data processing or calculations, the processor ED20 may be configured to load a command and/or data received from other components (e.g., the sensor module ED76, the communication module ED90) into the volatile memory ED32, process the command and/or the data stored in a volatile memory ED32, and store resultant data in a nonvolatile memory ED34. The processor ED20 may include a main processor ED21 (e.g., a central processing unit (CPU), an application processor (AP), etc.) and an auxiliary processor ED23 (e.g., a graphics processing unit (GPU), an image signal processor, a sensor hub processor, a communication processor, etc.) which may independently operate or operate with the main processor ED21. The auxiliary processor ED23 may use less power than the main processor ED21 and may perform specialized functions.

When the main processor ED21 is in an inactive state (a sleep state), the auxiliary processor ED23 may take charge of an operation of controlling functions and/or states related to one or more components (e.g., the display apparatus ED60, the sensor module ED76, the communication module ED90, etc.) from among the components of the electronic device ED01, or when the main processor ED21 is in an active state (an application execution state), the auxiliary processor ED23 may perform the same operation along with the main processor ED21. The auxiliary processor ED23 (e.g., the image signal processor, the communication processor, etc.) may be realized as part of other functionally-related components (e.g., the camera module ED80, the communication module ED90, etc.)

The memory ED30 may store various data required by the components (e.g., the processor ED20, the sensor module ED76, etc.) of the electronic device ED01. The data may include, for example, software (e.g., the program ED40, etc.), input data and/or output data of a command related to the software. The memory ED30 may include the volatile memory ED32 and/or the nonvolatile memory ED34. The nonvolatile memory ED32 may include an internal memory ED36 fixedly mounted in the electronic device ED01 and a removable external memory ED38.

The program ED40 may be stored in the memory ED30 as software, and may include an operating system ED42, middleware ED44, and/or an application ED46.

The input device ED50 may receive a command and/or data to be used by the components (e.g., the processor ED20, etc.) of the electronic device ED01 from the outside of the electronic device ED01. The input device ED50 may include a microphone, a mouse, a keyboard, and/or a digital pen (e.g., a stylus pen, etc.)

The sound output device ED55 may output a sound signal to the outside of the electronic device ED01. The sound output device ED55 may include a speaker and/or a receiver. The speaker may be used for a general purpose, such as multimedia playing or recording playing, and the receiver may be used to receive an incoming call. The receiver may be coupled to the speaker as part of the speaker or may be realized as a separate device.

The display apparatus ED60 may visually provide information to the outside of the electronic device ED01. The display apparatus ED60 may include a display, a hologram device, or a controlling circuit for controlling a projector and a corresponding device. The display apparatus ED60 may include touch circuitry configured to sense a touch operation and/or sensor circuitry (e.g., a pressure sensor, etc.) configured to measure an intensity of a force generated by the touch operation.

The audio module ED70 may convert sound into an electrical signal or an electrical signal into sound. The audio module ED70 may obtain sound via the input device ED50 or may output sound via the sound output device ED55 and/or a speaker and/or a headphone of an electronic device (e.g., the electronic device ED02, etc.) directly or wirelessly connected to the electronic device ED01.

The sensor module ED76 may sense an operation state (e.g., power, temperature, etc.) of the electronic device ED01 or an external environmental state (e.g., a user state, etc.) and generate electrical signals and/or data values corresponding to the sensed state. The sensor module ED76 may include a gesture sensor, a gyro-sensor, an atmospheric sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface ED77 may support one or a plurality of designated protocols to be used for the electronic device ED01 to be directly or wirelessly connected to another electronic device (e.g., the electronic device ED02, etc.) The interface ED77 may include a high-definition multimedia interface (HDMI) interface, a universal serial bus (USB) interface, an SD card interface, and/or an audio interface.

A connection terminal ED78 may include a connector, through which the electronic device ED01 may be physically connected to another electronic device (the electronic device ED02, etc.) The connection terminal ED78 may include an HDMI connector, a USB connector, an SD card connector, and/or an audio connector (e.g., a headphone connector, etc.)

A haptic module ED79 may convert an electrical signal into a mechanical stimulus (e.g., vibration, motion, etc.) or an electrical stimulus which is recognizable to a user via haptic or motion sensation. The haptic module ED79 may include a motor, a piezoelectric device, and/or an electrical stimulus device.

The camera module ED80 may capture a still image and a video. The camera module ED80 may include a lens assembly including one or a plurality of lenses, the image sensor 1000 of FIG. 1, image signal processors, and/or flashes. The lens assemblies included in the camera module ED80 may collect light emitted from an object, an image of which is to be captured.

The power management module ED88 may manage power supplied to the electronic device ED01. The power management module 8388 may be realized as part of a power management integrated circuit (PMIC).

The battery ED89 may supply power to the components of the electronic device ED01. The battery ED89 may include a non-rechargeable primary battery, rechargeable secondary battery, and/or a fuel battery.

The communication module ED90 may support establishment of direct (wired) communication channels and/or wireless communication channels between the electronic device ED01 and other electronic devices (e.g., the electronic device ED02, the electronic device ED04, the server ED08, etc.) and communication performance through the established communication channels. The communication module ED90 may include one or a plurality of communication processors separately operating from the processor ED20 (e.g., an application processor) and supporting direct communication and/or wireless communication. The communication module ED90 may include a wireless communication module ED92 (e.g., a cellular communication module, a short-range wireless communication module, a global navigation satellite system (GNSS) communication module, and/or a wired communication module ED94 (e.g., a local area network (LAN) communication module, a power line communication module, etc.) From these communication modules, a corresponding communication module may communicate with other electronic devices through a first network ED98 (e.g., a short-range wireless communication network, such as Bluetooth, Wifi direct, or infrared data association (IrDa)) or a second network ED99 (e.g., a remote communication network, such as a cellular network, the Internet, or a computer network (LAN, WAN, etc.)) Various types of communication modules described above may be integrated as a single component (e.g., a single chip) or realized as a plurality of components (a plurality of chips). The wireless communication module ED92 may identify and authenticate the electronic device ED01 within the first network ED98 and/or the second network ED99 by using subscriber information (e.g., international mobile subscriber identification (IMSI), etc.) stored in the subscriber identification module ED96.

The antenna module ED97 may transmit a signal and/or power to the outside (e.g., other electronic devices) or receive the same from the outside. The antenna may include an emitter including a conductive pattern formed on a substrate (e.g., a printed circuit board (PCB), etc.) The antenna module ED97 may include an antenna or a plurality of antennas. When the antenna module ED97 includes a plurality of antennas, an appropriate antenna which is suitable for a communication method used in the communication networks, such as the first network ED98 and/or the second network ED99, may be selected. Through the selected antenna, signals and/or power may be transmitted or received between the communication module ED90 and other electronic devices. In addition to the antenna, another component (e.g., a radio frequency integrated circuit (RFIC), etc.) may be included in the antenna module ED97.

One or more of the components of the electronic device ED01 may be connected to one another and exchange signals (e.g., commands, data, etc.) with one another, through communication methods performed among peripheral devices (a bus, general purpose input and output (GPIO), a serial peripheral interface (SPI), a mobile industry processor interface (MIPI), etc.)

The command or the data may be transmitted or received between the electronic device ED01 and another external electronic device ED04 through the server ED08 connected to the second network ED99. Other electronic devices ED02 and ED04 may be electronic devices that are homogeneous or heterogeneous types with respect to the electronic device ED01. All or part of operations performed in the electronic device ED01 may be performed by one or a plurality of the other electronic devices ED02, ED04, and ED08. For example, when the electronic device ED01 has to perform a function or a service, instead of directly performing the function or the service, the one or a plurality of other electronic devices may be requested to perform part or all of the function or the service. The one or a plurality of other electronic devices receiving the request may perform an additional function or service related to the request and may transmit a result of the execution to the electronic device ED01. To this end, cloud computing, distribution computing, and/or client-server computing techniques may be used.

Figure 24:
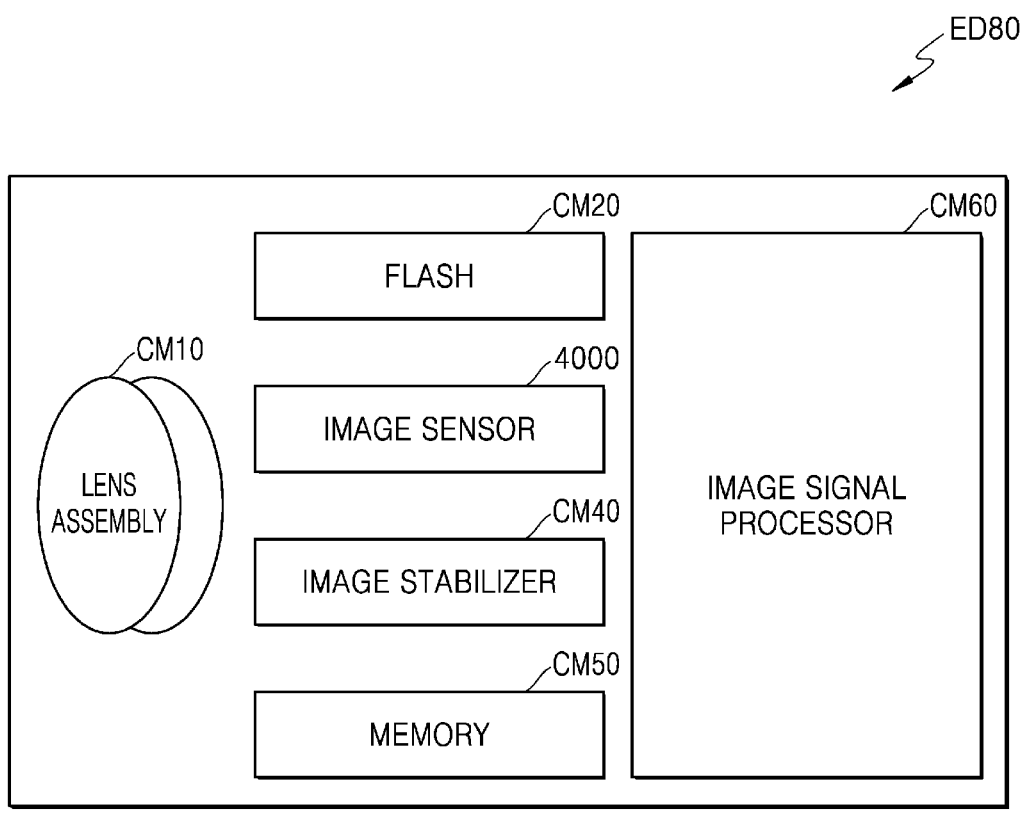
FIG. 24 is a schematic block diagram showing a camera module of FIG. 23.

FIG. 24 is a schematic block diagram showing the camera module ED80 of FIG. 23.

Referring to FIG. 24, the camera module ED80 may include a lens assembly CM10, a flash CM20, the image sensor 4000 (FIG. 1), an image stabilizer CM40, a memory CM50 (a buffer memory, etc.), and/or an image signal processor CM60. The lens assembly CM10 may collect light emitted from a subject that is a target of image capture. The camera module 1880 may include a plurality of lens assemblies CM10, and in this case, the camera module ED80 may be a dual camera, a 360 degree camera, or a spherical camera. Some of the plurality of lens assemblies CM10 may have the same lens property (e.g., an angle of view, a focal length, AF, a F number, optical zoom, etc.), or may have different lens properties. The lens assembly CM10 may include a wide-angle lens or a telephoto lens.

The flash CM20 may emit light used to enhance light emitted or reflected from a subject. The flash CM20 may include one or more light emitting diodes (e.g., Red-Green-Blue (RGB) LED, White LED, Infrared LED, Ultraviolet LED, etc.), and/or a Xenon Lamp. The image sensor 1000 may be the image sensor 1000 described in FIG. 1, and may obtain an image corresponding to the subject by converting the light emitted or reflected from the subject and transmitted through the lens assembly CM10 into an electrical signal. The image sensor 1000 may include one or a plurality of sensors selected from image sensors having different attributes, such as an RGB sensor, a black and white (BW) sensor, an IR sensor, or a UV sensor. Each of the sensors included in the image sensor 1000 may be implemented as a Charged Coupled Device (CCD) sensor and/or a Complementary Metal Oxide Semiconductor (CMOS) sensor.

The image stabilizer CM40 may move one or more lenses included in the lens assembly CM10 or the image sensors 4000 in a specific direction in response to the movement of the camera module ED80 or the electronic apparatus CM01 including the camera module ED80 or control the operating characteristics of the image sensor 4000 (e.g., adjusting read-out timing) to compensate for a negative influence due to the movement. The image stabilizer CM40 may use a gyro sensor or an acceleration sensor disposed inside or outside the camera module ED80 to detect the movement of the camera module ED80 or the electronic apparatus ED01. The image stabilizer CM40 may be implemented optically.

The memory CM50 may store part or entire data of an image obtained through the image sensor 4000 for a next image processing operation. For example, when a plurality of images are obtained at high speed, obtained original data (e.g., Bayer-Patterned data, high-resolution data, etc.) may be stored in the memory CM50, only low-resolution images may be displayed, and then the original data of a selected (e.g., a user selection) image may be transmitted to the image signal processor CM60. The memory CM50 may be integrated into the memory ED30 of the electronic apparatus ED01, or may be configured as a separate memory that operates independently.

The image signal processor CM60 may perform image processing operations on the image obtained through the image sensor 4000 or the image data stored in the memory CM50. The image processing may include depth map generation, 3D modeling, panorama generation, feature point extraction, image synthesis, and/or image compensation (e.g., noise reduction, resolution adjustment, brightness adjustment, blurring, sharpening, softening, etc.) The image signal processor CM60 may perform control (e.g., exposure time control, read-out timing control, etc.) of components (e.g., the image sensor 4000, etc.) included in the camera module ED80. The image processed by the image signal processor CM60 may be stored again in the memory CM50 for further processing or may be provided to external components (e.g., the memory ED30, the display apparatus ED60, the electronic apparatus ED02, the electronic apparatus ED04, the server ED08, etc.) of the camera module ED80. The image signal processor CM60 may be integrated into the processor ED20 or may be configured as a separate processor that operates independently from the processor ED20. When the image signal processor CM60 is configured as the processor separate from the processor ED20, the image processed by the image signal processor CM60 may undergo additional image processing by the processor ED20 and then be displayed through the display apparatus ED60.

The electronic apparatus ED01 may include the plurality of camera modules ED80 having different properties or functions. In this case, one of the plurality of camera modules ED80 may be a wide-angle camera, and the other may be a telephoto camera. Similarly, one of the plurality of camera modules ED80 may be a front camera and the other may be a rear camera.

FIGS. 25 to 34 show various examples of electronic devices to which the image sensors 4000 are applied according to embodiments.

Figure 25:
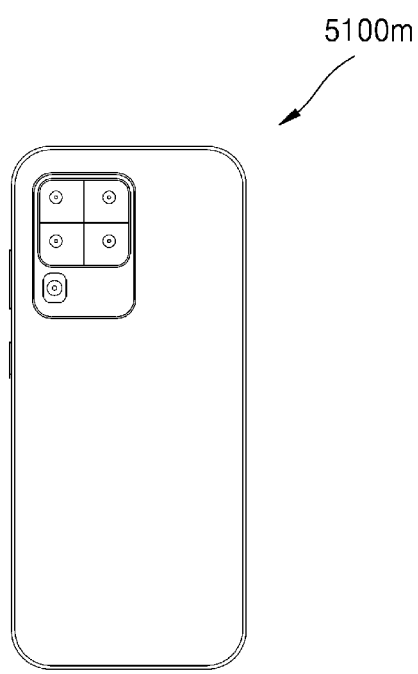
FIGS. 25 to 34 show various examples of electronic devices to which image sensors are applied according to embodiments.
Figure 26:
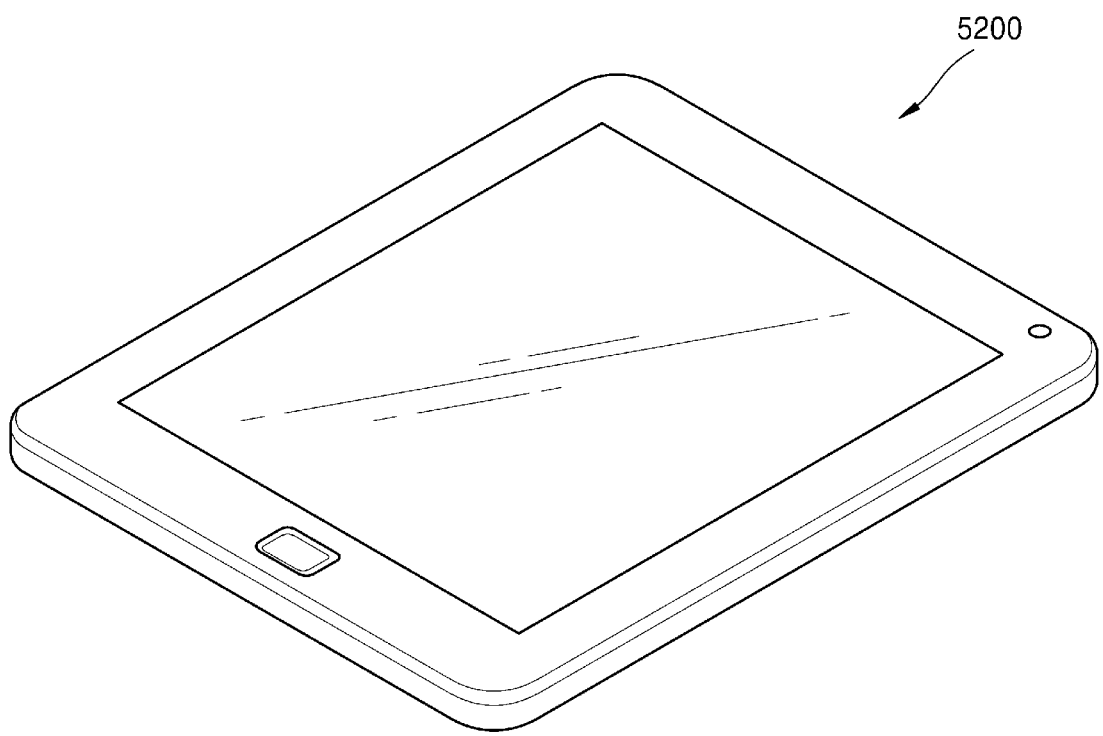
Figure 27:
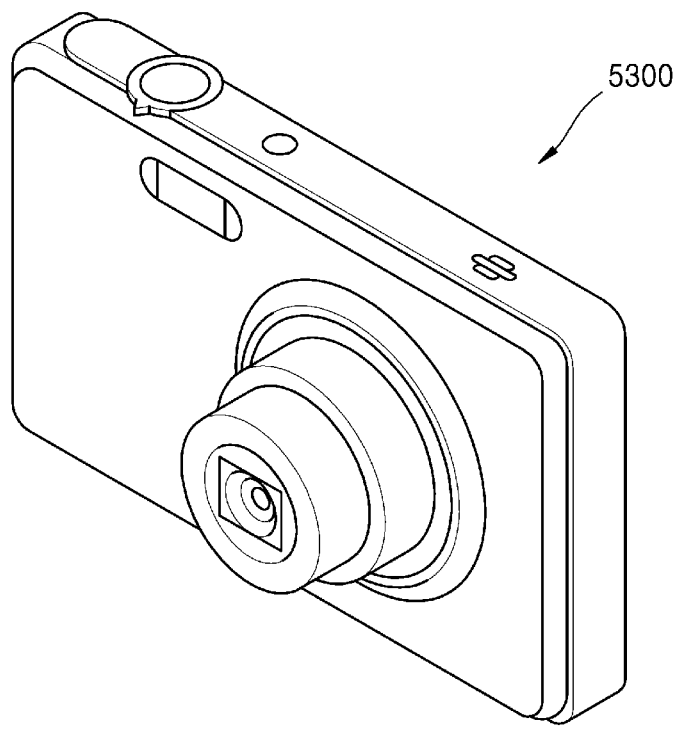
Figure 28:
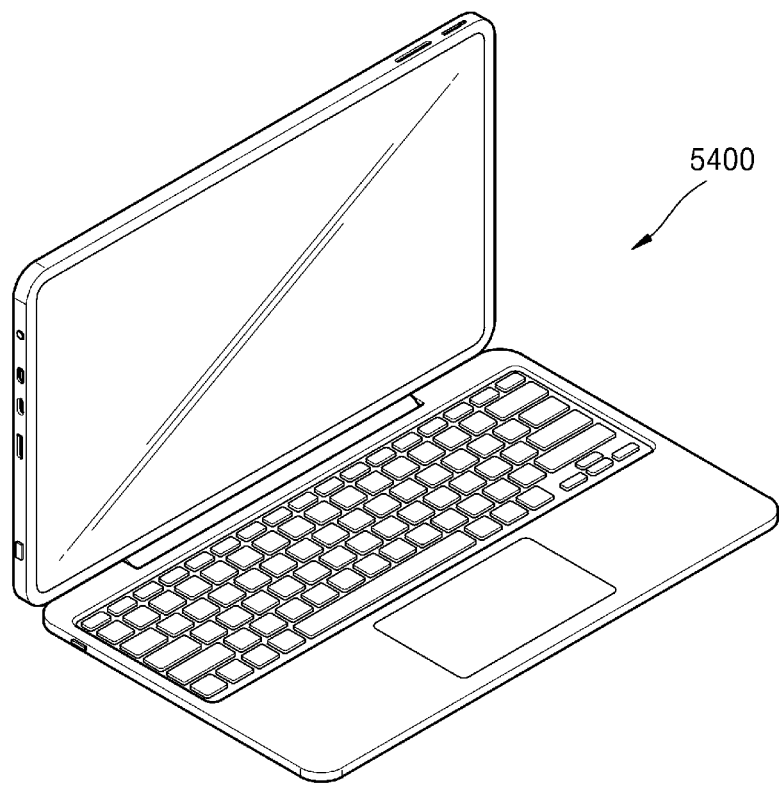
Figure 29:
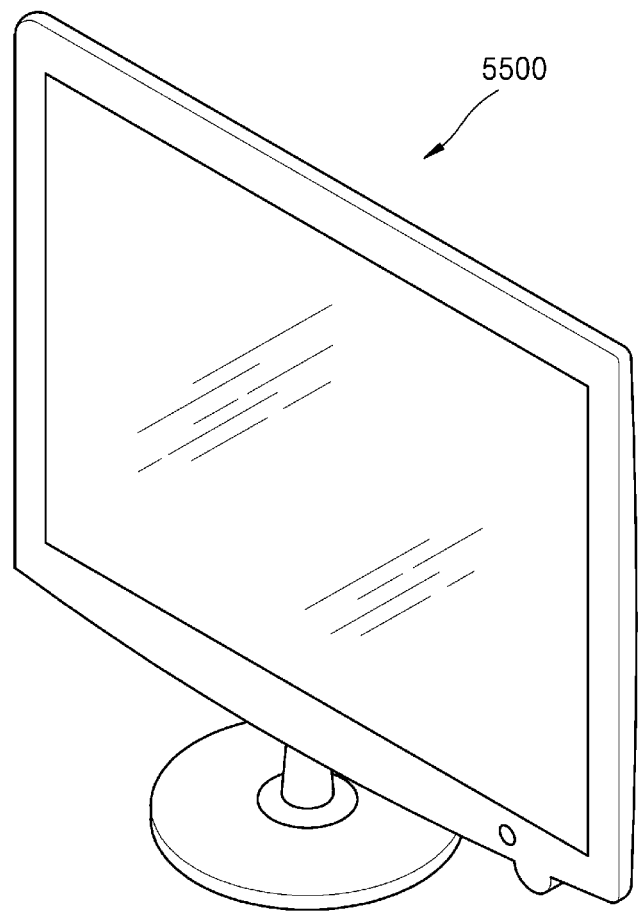

The image sensor 4000 according to the embodiments may be applied to the mobile phone or a smartphone 5100m shown in FIG. 25, a tablet or a smart tablet 5200 shown in FIG. 26, a digital camera or a camcorder 5300 shown in FIG. 27, a laptop computer 5400 shown in FIG. 28, or a television or a smart television 5500 shown in FIG. 29, etc. For example, the smartphone 5100m or the smart tablet 5200 may include a plurality of high-resolution cameras each including a high-resolution image sensor. Depth information of objects in an image may be extracted, out condensing of the image may be adjusted, or objects in the image may be automatically identified by using the high-resolution cameras.

Figure 30:
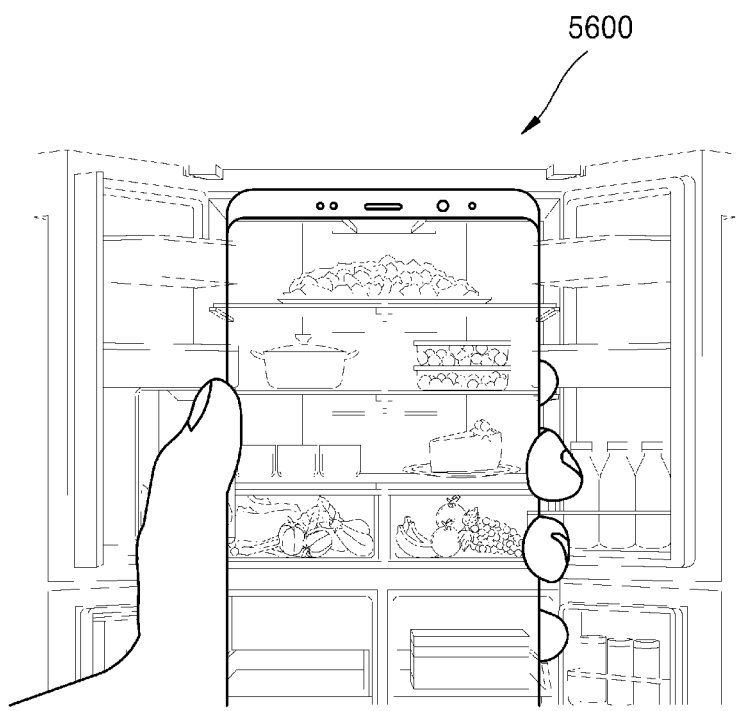
Figure 31:
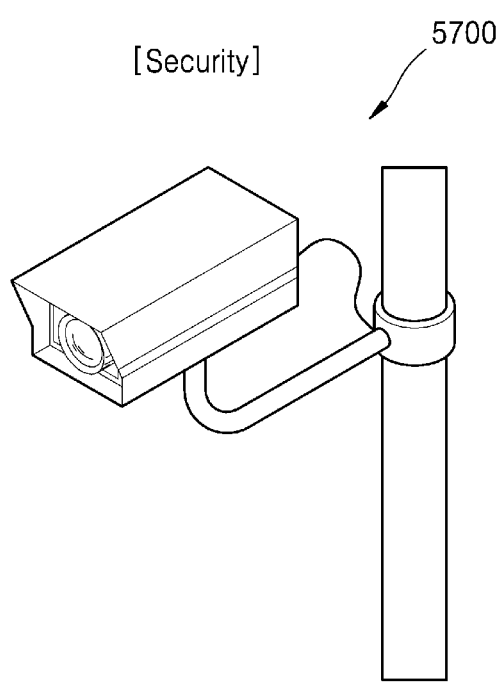
Figure 32:
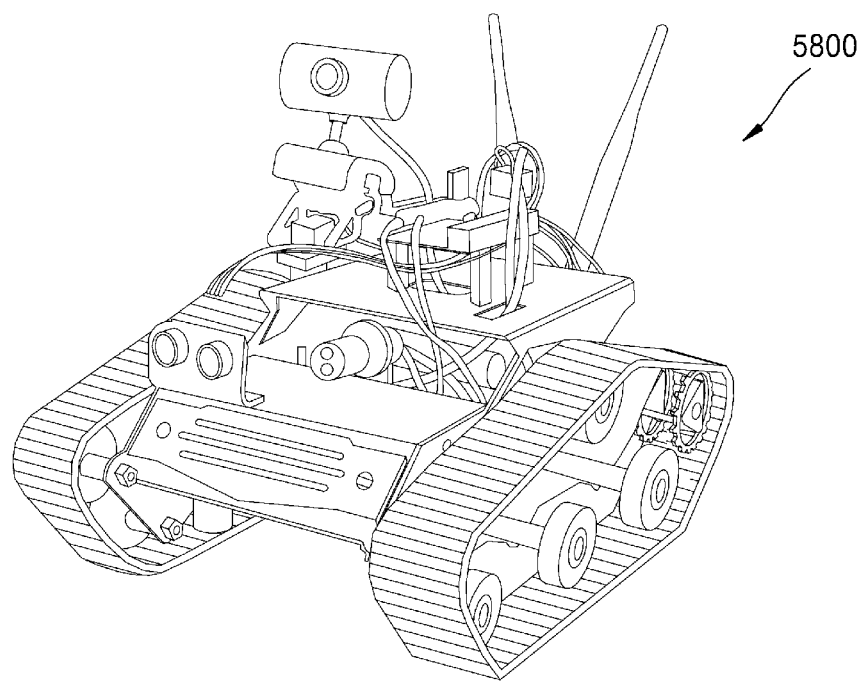
Figure 33:
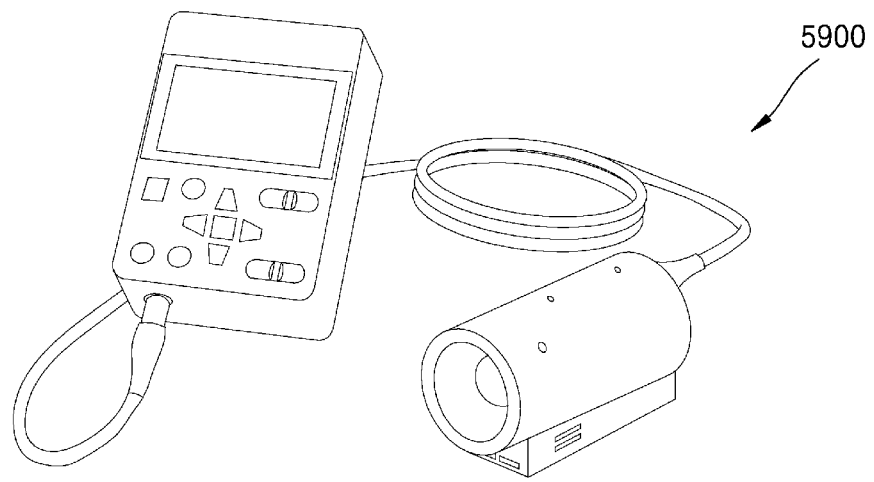

Also, the image sensor 4000 may be applied to a smart refrigerator 5600 shown in FIG. 30, a surveillance camera 5700 shown in FIG. 31, a robot 5800 shown in FIG. 32, a medical camera 5900 shown in FIG. 33, etc. For example, the smart refrigerator 5600 may automatically recognize food in the refrigerator by using the image sensor, and may notify the user of an existence of a certain kind of food, kinds of food put into or taken out, etc. through a smartphone. Also, the surveillance camera 5700 may provide an ultra-high-resolution image and may allow the user to recognize an object or a person in the image even in dark environment by using high sensitivity. The robot 5800 may be input to a disaster or industrial site that a person may not directly access, to provide the user with high-resolution images. The medical camera 5900 may provide high-resolution images for diagnosis or surgery, and may dynamically adjust a field of view.

Figure 34:
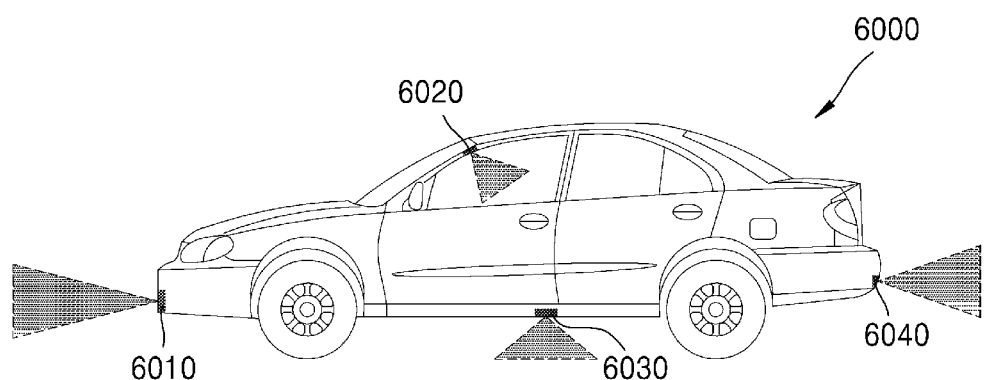

Also, the image sensor 4000 may be applied to a vehicle 6000 as shown in FIG. 34. The vehicle 6000 may include a plurality of vehicle cameras 6010, 6020, 6030, and 6040 arranged on various positions. Each of the vehicle cameras 6010, 6020, 6030, and 6040 may include the image sensor according to the embodiment. The vehicle 6000 may provide a driver with various information about the interior of the vehicle 6000 or the periphery of the vehicle 6000 by using the plurality of vehicle cameras 6010, 6020, 6030, and 6040, and may provide the driver with the information necessary for the autonomous travel by automatically recognizing an object or a person in the image.

The present disclosure may provide a hyperspectral element having high resolution and broadband characteristics.

The present disclosure may provide a hyperspectral sensor having high resolution and broadband characteristics.

The present disclosure may provide a hyperspectral image generating apparatus having high resolution and broadband characteristics.

However, the effect of the embodiments is not limited to the above disclosure.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A hyperspectral element comprising:
   a multi filter comprising:
      a first sub filter through which first wavelength light having a first wavelength passes; and
      a second sub filter through which second wavelength light having a second wavelength passes, the second wavelength being different from the first wavelength; and
   a multi detector configured to detect the first wavelength light and the second wavelength light,
   wherein the first sub filter and the second sub filter are arranged in series in an optical path of incident light which is incident onto the multi filter,
   each of the first sub filter and the second sub filter comprises first refractive index films and second refractive index films that are alternately stacked, and
   the first refractive index films have different refractive indexes than the second refractive index films.

2. The hyperspectral element of claim 1, wherein the multi detector comprises
   a first sub detector comprising a first light detection band overlapping the first wavelength and the second wavelength; and
   a second sub detector comprising a second light detection band overlapping any one of the first wavelength and the second wavelength, and
   wherein the first sub detector and the second sub detector are arranged in series.

3. The hyperspectral element of claim 2, further comprising:
   a spectroscopic processor;

wherein the first sub detector is configured to generate and provide a first channel signal with respect to the first wavelength light and the second wavelength light to the spectroscopic processor, wherein the second sub detector is configured to generate and provide a second channel signal with respect to the second wavelength light to the spectroscopic processor, and wherein the spectroscopic processor is configured to generate information about intensities of the first wavelength light and the second wavelength light based on the first and second channel signals.

4. The hyperspectral element of claim 2, wherein the multi detector further comprises an ultraviolet detector, and wherein the ultraviolet detector is arranged in series with the first sub detector and the second sub detector, in the optical path of the incident light.

5. The hyperspectral element of claim 2, wherein the multi detector further comprises an infrared detector, and wherein the infrared detector is arranged in series with the first sub detector and the second sub detector, in the optical path of the incident light.

6. The hyperspectral element of claim 1, wherein the first refractive index films of the first sub filter and the first refractive index films of the second sub filter have different thicknesses.

7. The hyperspectral element of claim 1, wherein each of the first sub filter and the second sub filter comprises:

a first reflective layer;
a second reflective layer; and
a nanostructure layer provided between the first reflective layer and the second reflective layer,
wherein the nanostructure layer comprises a plurality of nano rods, and
wherein the plurality of nano rods are asymmetrically arranged.

8. The hyperspectral element of claim 1, wherein each of the first sub filter and the second sub filter comprises:

a first reflective layer;
a second reflective layer; and
a nanostructure layer provided between the first reflective layer and the second reflective layer,
wherein the nanostructure layer comprises a plurality of nano holes, and
wherein the plurality of nano holes are asymmetrically arranged.

9. The hyperspectral element of claim 1, wherein the multi detector comprises n-type films and p-type films that are alternately stacked, and wherein the n-type films and the p-type films form a first photodiode and a second photodiode, respectively, and the second photodiode is arranged more inside the multi detector than the first photodiode.

10. The hyperspectral element of claim 9, wherein the multi filter is provided on the multi detector, wherein the first photodiode is configured to detect the first wavelength light and the second wavelength light, and wherein the second photodiode is configured to detect light having a relatively long wavelength between the first wavelength light and the second wavelength light.

11. The hyperspectral element of claim 10, further comprising:

a spectroscopic processor;

wherein the first photodiode is configured to generate and provide a first channel signal with respect to the first wavelength light and the second wavelength light to the spectroscopic processor, wherein the second photodiode is configured to generate and provide a second channel signal with respect to the second wavelength light to the spectroscopic processor, and wherein the spectroscopic processor is configured to generate information about intensities of the first and second wavelength lights based on the first and second channel signals.

12. The hyperspectral element of claim 1, further comprising:

a micro lens;
wherein the micro lens is disposed in series with the multi filter, and collects the incident light into the multi filter.

13. A hyperspectral image generating apparatus comprising:

the hyperspectral element of claim 1 configured to receive the incident light provided from a measurement target to generate a first channel signal with respect to light having a first wavelength and light having a second wavelength, and a second channel signal with respect to the light having the first wavelength;

a spectroscopic processor configured to generate first hyperspectral information about an intensity of the light having the first wavelength for each position of the measurement target and second hyperspectral information about an intensity of the light having the second wavelength for each position of the measurement target based on the first channel signal and the second channel signal;

a main processor configured to generate hyperspectral image information based on the first hyperspectral information and the second hyperspectral information; and a display displaying a hyperspectral image based on the hyperspectral image information.

14. A hyperspectral sensor comprising:
a plurality of pixels configured to sense a light transmission spectrum of incident light;
a spectroscopic processor; and
a main processor,
wherein each of the plurality of pixels comprises:
a first multi filter through which first wavelength light having a first wavelength and second wavelength light having a second wavelength pass, the second wavelength being longer than the first wavelength, among the incident light;

a first multi detector configured to generate and provide a first channel signal with respect to the first and second wavelength lights and a second channel signal with respect to the second wavelength light to the spectroscopic processor;

a second multi filter through which third wavelength light having a third wavelength and fourth wavelength light having a fourth wavelength pass, among the incident light, the fourth wavelength being longer than the third wavelength; and a second multi detector configured to generate and provide a third channel signal with respect to the third wavelength light and the fourth wavelength light and a fourth channel signal with respect to the fourth wavelength light to the spectroscopic processor, and wherein the spectroscopic processor is configured to generate and provide information about intensities of the first wavelength light, the second wavelength light, the third wavelength light, and the fourth wavelength light based on the first to fourth channel signals to the main processor.

15. The hyperspectral sensor of claim 14, wherein the first multi filter comprises a first sub filter and a second sub filter,
wherein a light transmission spectrum of the first sub filter comprises a first use band and a first sub light transmission region outside the first use band,
wherein a light transmission spectrum of the second sub filter comprises a second use band and a second sub light transmission region outside the second use band,
wherein the first wavelength is included in the first use band and the second sub light transmission region, and
wherein the second wavelength is included in the second use band and the first sub light transmission region.

16. The hyperspectral sensor of claim 15, wherein the first use band and the second use band partially overlap.

17. The hyperspectral sensor of claim 15, wherein the second multi filter comprises a third sub filter and a fourth sub filter,
wherein a light transmission spectrum of the third sub filter comprises a third use band and a third sub light transmission region,
wherein a light transmission spectrum of the fourth sub filter comprises a fourth use band and a fourth sub light transmission region,
wherein the third wavelength is included in the third use band and the fourth sub light transmission region, and
wherein the fourth wavelength is included in the fourth use band and the third sub light transmission region.

18. The hyperspectral sensor of claim 17, wherein the third use band partially overlaps the fourth use band.

19. The hyperspectral sensor of claim 17, wherein the first multi filter and the second multi filter are arranged in parallel,
wherein the first sub filter and the second sub filter are arranged in series in an optical path of the incident light, and
wherein the third sub filter and the fourth sub filter are arranged in series in the optical path of the incident light.

20. The hyperspectral sensor of claim 14, wherein the first multi detector comprises:
a first sub detector configured to receive the first wavelength light and the second wavelength light and generate the first channel signal; and
a second sub detector configured to receive the second wavelength light and generate the second channel signal, and
wherein the second multi detector comprises:
a third sub detector configured to receive the third wavelength light and the fourth wavelength light and generate the third channel signal; and
a fourth sub detector configured to receive the fourth wavelength light and generate the fourth channel signal.

21. The hyperspectral sensor of claim 20, wherein, in the second multi detector, the first sub detector, and the second sub detector are arranged in series in an optical path of the incident light.

22. A hyperspectral element comprising:
a multi filter comprising:
a first sub filter through which first wavelength light having a first wavelength passes; and
a second sub filter through which second wavelength light having a second wavelength passes, the second wavelength being different from the first wavelength; and
a multi detector configured to detect the first wavelength light and the second wavelength light,
wherein the first sub filter and the second sub filter are arranged in series in an optical path of incident light which is incident onto the multi filter wherein
a light transmission spectrum of the first sub filter comprises a first use band and a first sub light transmission region outside the first use band,
wherein a light transmission spectrum of the second sub filter comprises a second use band and a second sub light transmission region outside the second use band,
wherein the first wavelength is included in the first use band and the second sub light transmission region, and
wherein the second wavelength is included in the second use band and the first sub light transmission region,
wherein the first sub filter is configured to filter out first remaining wavelengths other than the first wavelength from the first use band, and the second sub filter is configured to filter out second remaining wavelengths other than the second wavelength from the second use band.

23. The hyperspectral element of claim 22, wherein the first use band partially overlaps the second use band.

* * * * *